(12) United States Patent
Lee et al.

(10) Patent No.: US 12,029,144 B2
(45) Date of Patent: Jul. 2, 2024

(54) ENCAPSULATION LAYER FOR CHALCOGENIDE MATERIAL

(71) Applicant: Eugenus, Inc., San Jose, CA (US)

(72) Inventors: Sang Young Lee, San Jose, CA (US); Sung-Hoon Jung, Santa Clara, CA (US); Jerry Mack, San Jose, CA (US); Niloy Mukherjee, San Ramon, CA (US)

(73) Assignee: Eugenus, Inc., San Jose, CA (US)

( * ) Notice: Subject to any disclaimer, the term of this patent is extended or adjusted under 35 U.S.C. 154(b) by 565 days.

(21) Appl. No.: 17/211,100

(22) Filed: Mar. 24, 2021

(65) Prior Publication Data

US 2022/0310917 A1 Sep. 29, 2022

(51) Int. Cl.
*H01L 45/00* (2006.01)
*H01L 27/24* (2006.01)
*H10B 63/00* (2023.01)
*H10N 70/00* (2023.01)
*H10N 70/20* (2023.01)

(52) U.S. Cl.
CPC .......... *H10N 70/882* (2023.02); *H10B 63/84* (2023.02); *H10N 70/041* (2023.02); *H10N 70/231* (2023.02); *H10B 63/24* (2023.02)

(58) Field of Classification Search
CPC .................................................... H10N 70/231
See application file for complete search history.

(56) References Cited

U.S. PATENT DOCUMENTS

| 8,261,908 | B2 | 9/2012 | Ma |
| 9,741,815 | B2 | 8/2017 | Xie et al. |
| 9,748,093 | B2 | 8/2017 | Reilly et al. |
| 2002/0197814 | A1 | 12/2002 | Marsh et al. |
| 2003/0213365 | A1 | 11/2003 | Jantsch et al. |
| 2007/0108430 | A1 | 5/2007 | Lung |
| 2007/0237699 | A1 | 10/2007 | Clark |
| 2015/0228923 | A1* | 8/2015 | Schicktanz ............ H10K 71/00 438/26 |

(Continued)

FOREIGN PATENT DOCUMENTS

KR 10-2016-0148473 A 12/2016

OTHER PUBLICATIONS

International Search Report and Written Opinion dated Nov. 26, 2021 in Application No. PCT/US2021/048909, 19 pages.

(Continued)

*Primary Examiner* — Mounir S Amer
(74) *Attorney, Agent, or Firm* — Knobbe, Martens, Olson & Bear, LLP

(57) ABSTRACT

The disclosed technology generally relates to semiconductor devices, and more particularly to an encapsulation layer for a semiconductor device having a chalcogenide material, and methods of forming the same. In one aspect, a method of fabricating a semiconductor device comprises providing a substrate having an exposed surface comprising a chalcogenide material. The method additionally comprises forming a low-electronegativity (low-$\chi$) metal oxide layer on the chalcogenide material by cyclically exposing the substrate to a low-$\chi$ metal precursor and an oxygen precursor comprising $O_2$, wherein the low-$\chi$ metal of the metal precursor has an electronegativity of 1.6 or lower.

26 Claims, 12 Drawing Sheets

(56) References Cited

U.S. PATENT DOCUMENTS

| | | | |
|---|---|---|---|
| 2015/0243883 A1* | 8/2015 | Swaminathan | H01L 21/0228 |
| | | | 118/723 R |
| 2016/0372365 A1 | 12/2016 | Tang et al. | |
| 2018/0350587 A1 | 12/2018 | Jia et al. | |
| 2020/0033425 A1* | 1/2020 | Wang | G01R 33/0052 |
| 2020/0066744 A1 | 2/2020 | Yun et al. | |
| 2020/0066972 A1* | 2/2020 | Yang | H01F 41/308 |
| 2020/0075674 A1* | 3/2020 | Song | H10N 70/066 |
| 2020/0381623 A1* | 12/2020 | Qi | H10N 70/801 |

OTHER PUBLICATIONS

Chen et al., "Emerging Nanoelectronic Devices", © 2015 John Wiley and Sons Ltd., in 30 pages.

Jayanti et al., "Technique to improve performance of Al2O3 interpoly dielectric using a La2O3 interface scavenging layer for floating gate memory structures", Appl. Phys. Lett. 96, 092905 (2010). https://doi.org/10.1063/1.3355547.

Maimaiti, M., "A Study on Interfacial Properties of $La_2O_3$ Gate Dielectrics with Thickness Scaling", Tokyo Institute of Technology, Feb. 8, 2012, 175 pages.

International Preliminary Report on Patentability dated Oct. 5, 2023 in Application No. PCT/US2021/048909 in 12 pages.

\* cited by examiner

ENCAPSULATION LAYER FOR CHALCOGENIDE MATERIAL

BACKGROUND

Field of the Invention

The disclosed technology generally relates to semiconductor devices, and more particularly to an encapsulation layer for a semiconductor device having a chalcogenide material, and methods of forming the same.

Description of the Related Art

Nonvolatile memory or storage devices can be switched between memory states, e.g., logic 1 and 0 states, by changing a physical state of a storage element. For example, some nonvolatile memory devices, e.g., flash memory devices, can be switched between memory states by transferring charge to and from a floating gate configured as the storage element. Some other nonvolatile or storage devices can be switched between memory states by changing a resistance across a storage element. The latter type of nonvolatile memory devices include phase change memory (PCM) devices, which include a phase change material in the storage element. The PCM devices can be switched by inducing phase changes including crystallization and amorphization in the phase change material of the storage element.

The need for continued dimensional scaling, improved performance, low temperature integration, tunable resistance, voltage/current scaling and/or three-dimensional (3D) integration of PCM devices, among other trends, is driving a corresponding need for improved integration schemes for PCM devices.

SUMMARY

In one aspect, a method of fabricating a semiconductor device comprises providing a substrate having an exposed surface comprising a chalcogenide material. The method additionally comprises forming a low-electronegativity (low-$\chi$) metal oxide layer on the chalcogenide material by cyclically exposing the substrate to a low-$\chi$ metal precursor and an oxygen precursor comprising $O_2$, wherein the low-$\chi$ metal of the metal precursor has an electronegativity of 1.6 or lower.

In another aspect, a method of fabricating a semiconductor device comprises providing a substrate having formed thereon a chalcogenide layer. The method additionally comprises patterning the chalcogenide layer to expose sidewalls of the chalcogenide layer. The method further comprises forming a low electronegativity (low-$\chi$) metal oxide layer on the sidewalls of the chalcogenide layer by cyclically exposing the substrate to a low-$\chi$ metal precursor and an oxygen precursor at or below 300° C. without aid of plasma. The low-$\chi$ metal of the metal oxide has an electronegativity of 1.6 or lower.

In another aspect, a method of fabricating a semiconductor device comprises providing a substrate having formed thereon a chalcogenide material, wherein the chalcogenide material has formed at a surface region thereof an oxidized chalcogenide material. The method additionally comprises at least partly chemically reducing the oxidized chalcogenide material by exposing the oxidized chalcogenide material to a low electronegativity (low-$\chi$) metal precursor. The low-$\chi$ metal of the metal precursor has an electronegativity of 1.6 or lower, such that at an oxygen content of the surface region is reduced relative to the surface region prior to exposing the oxidized chalcogenide material to the low-$\chi$ metal precursor.

In another aspect, a phase change memory device comprises a memory cell disposed vertically between a first conductive line extending in a first direction and a second conductive line extending in a second lateral direction crossing the first lateral direction, wherein the memory cell comprises a phase change storage element and a selector element. The memory device further comprises a low electronegativity (low-$\chi$) metal oxide layer formed on a sidewall of the memory cell, wherein the low-$\chi$ metal of the low-$\chi$ metal oxide layer has an electronegativity of 1.6 or lower.

BRIEF DESCRIPTION OF THE DRAWINGS

Embodiments of this disclosure will now be described, by way of non-limiting examples, with reference to the accompanying drawings.

DETAILED DESCRIPTION

As described above, the need for continued dimensional scaling, improved performance, voltage/current scaling and/or three-dimensional (3D) integration of PCM devices, among other trends, is driving a corresponding need for improved process integration schemes thereof. The process integration schemes that need improvement include passivation schemes for memory cells of the PCM devices. To appreciate the need for such improvements, FIGS. 1 and 2 illustrate an example phase change memory cell and exemplary access operations that can be performed on the same, respectively.

Figure 1:
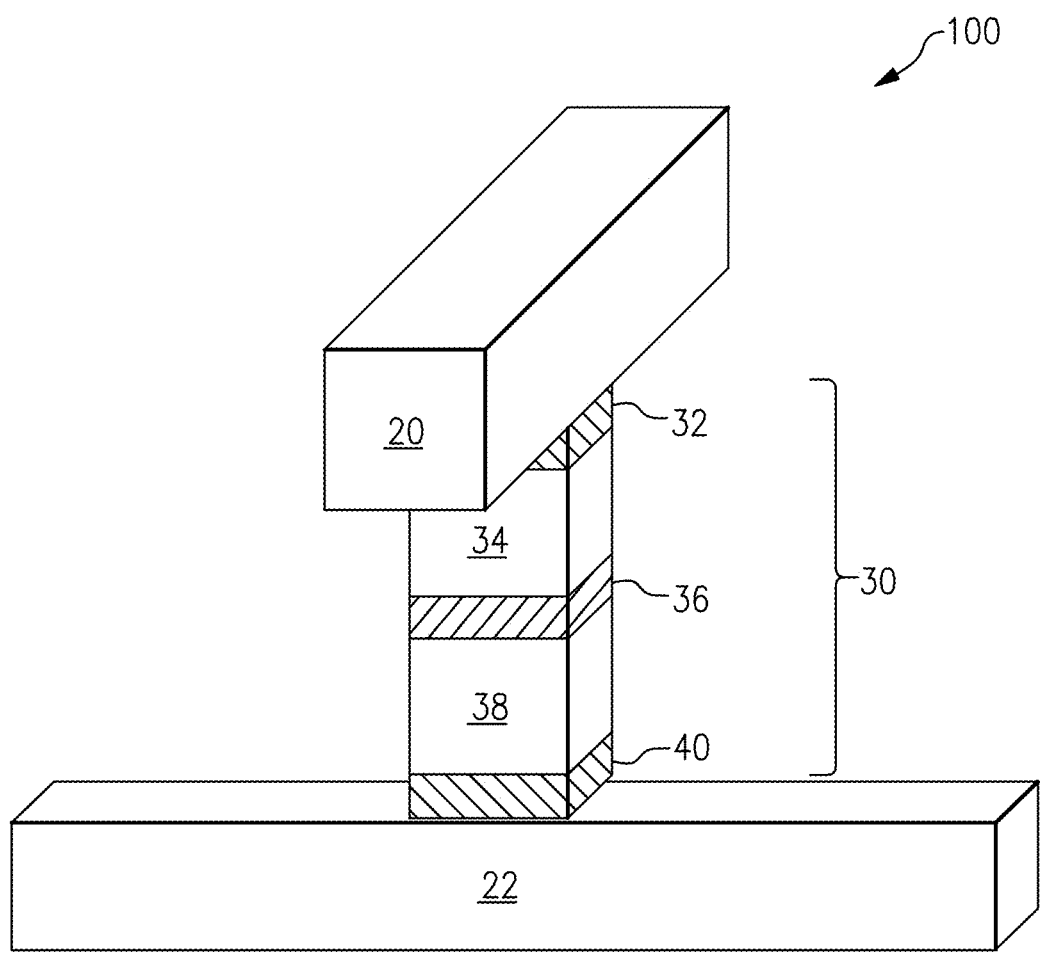
FIG. 1 shows an example phase change memory cell configured to be protected by an encapsulation layer, according to embodiments.

FIG. 1 shows an example of a phase change memory (PCM) device 100 including a PCM cell, which can benefit from an improved passivation, according to embodiments. The PCM device 100 includes a memory cell 30 including a phase change storage element 34 having formed on a bottom side thereof a middle electrode 36 and on a top side thereof a top electrode 32. The cell stack 30 may additionally include a selector element 38 which may be separated from the phase change storage element 34 by the middle electrode 36, and having formed on a bottom side thereof a bottom electrode 40. The selector element 38 may be, e.g., a two-terminal selector device. The cell stack 30 including the phase change storage element 34 and the selector element 38 may in turn be connected at one end through the top electrode 32 a top metallization line 20, e.g., one of a wordline and a bitline, and at the other end through the bottom electrode 40 a bottom metallization line 22, e.g., the other of the wordline and the bitline.

In the PCM device 100, one or both of the phase change storage element 34 and the selector element 38 may include a chalcogenide material. The phase change storage element 34 is configured to store a plurality of memory states, which can be nonvolatile or persistent memory states. The selector element 38 is electrically connected in series to the phase change storage element 34. The selector element 38 is configured as a switch for controlling the voltage and/or current that may be provided by a voltage and/or current source to the phase change storage element 34 for switching the phase change storage element 34 between or among the plurality of memory states.

Figure 2:
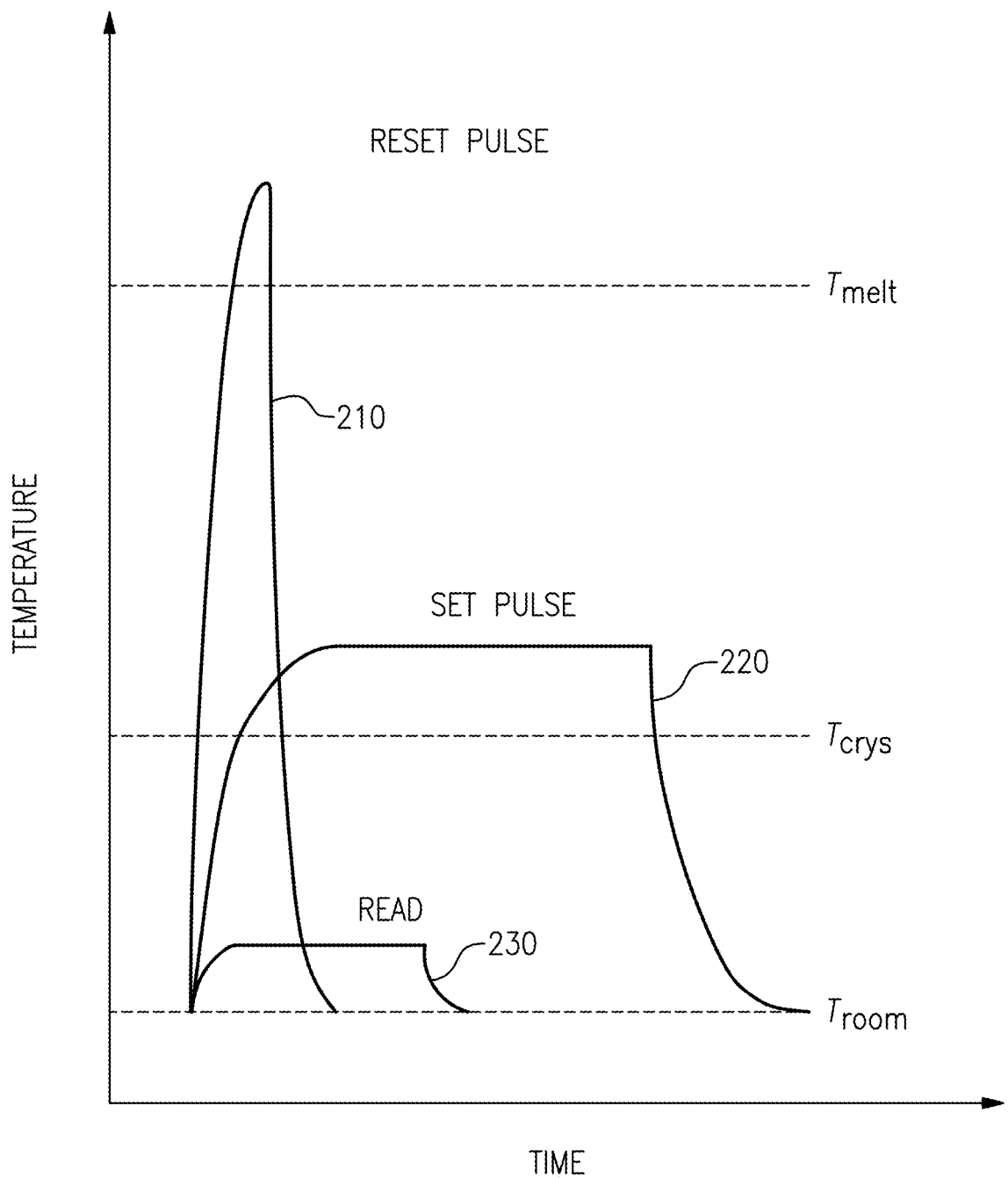
FIG. 2 schematically illustrates exemplary access operations that can be performed on a phase change memory device.

FIG. 2 schematically illustrates exemplary access operations that can be performed on the PCM device 100 described above with respect to FIG. 1. An operation to induce a crystalline-to-amorphous transition in the phase change storage element 34 (FIG. 1), or a RESET operation, is performed by applying a RESET pulse 210, e.g., a current or voltage pulse to the phase change storage element 34 (FIG. 1) in a low resistance state or SET state corresponding to a substantially crystalline state of the phase change material. The pulse can be applied using the selector element 38 to control the duration and/or magnitude thereof. The RESET pulse 210 causes the phase change material of the phase change storage element 34 (FIG. 1) to at least partly melt at the melting temperature (Tmelt) of the phase change material. After a peak of the RESET pulse 210 is reached, the phase change storage element is rapidly quenched within a time duration that is short enough to prevent substantial recrystallization of the phase change material.

Still referring to FIG. 2, an operation to induce an amorphous-to-crystalline transition of the phase change material, or a SET operation, is performed by applying a SET pulse 220, e.g., a current or voltage pulse to the phase change storage element 34 (FIG. 1) in a high resistance RESET state corresponding to a substantially amorphous state of the phase change material. The pulse can be applied by the selector element 38 to control the duration and/or magnitude thereof. The SET pulse 220 causes the phase change material of the phase change storage element 34 (FIG. 1) to at least partly recrystallize at the crystallization temperature (Tcrys).

An operation to determine the state of the phase change storage element 34 (FIG. 1), or a READ operation, may be performed by applying a read pulse 230, e.g., a current or voltage pulse, and sensing the resulting electrical signal using a sense amplifier. The pulse can be applied using the selector device to control the duration and/or magnitude thereof.

In the illustrated example of FIG. 1, the memory cell 30 is arranged as a pillar structure formed from a stack of corresponding layers. As described infra, the sidewalls each of the phase change storage element 34 and/or the selector element 38 may be exposed during fabrication. The sidewalls may be exposed to various processing environments including, e.g., air and moisture, as well as other processing gases and/or liquids. As a result, one or more sidewalls of the phase change storage element 34 and/or the selector element 38 may undesirably absorb or chemically react with the gases and/or liquids from the processing environment, which may degrade the device properties of the PCM device 100. In addition, as described above with respect to FIG. 2, after fabrication, various operations of the nonvolatile memory device as described herein can subject regions of the phase change storage element 34 and/or the selector element 38 to relatively high electric fields and/or temperatures as high as or exceeding the melting temperature of the phase change material, which can exceed several hundred degrees. Such operating conditions can further cause chemical reaction of the phase change storage element 34 and/or the selector element 38 with elements from surrounding materials, e.g., oxygen or moisture. As the PCM device 100 can be cyclically subjected to such conditions more than tens or hundreds of thousands of times, one or more of SET, RESET or READ voltages or currents can degrade over time, leading to reliability failures. Some of the failures can be attributed to post-fabrication contamination of different regions of the PCM device, including the phase change storage element 34 and/or the selector element 38.

Phase Change Memory Cell Lined with Encapsulation Layer

Figure 3A:
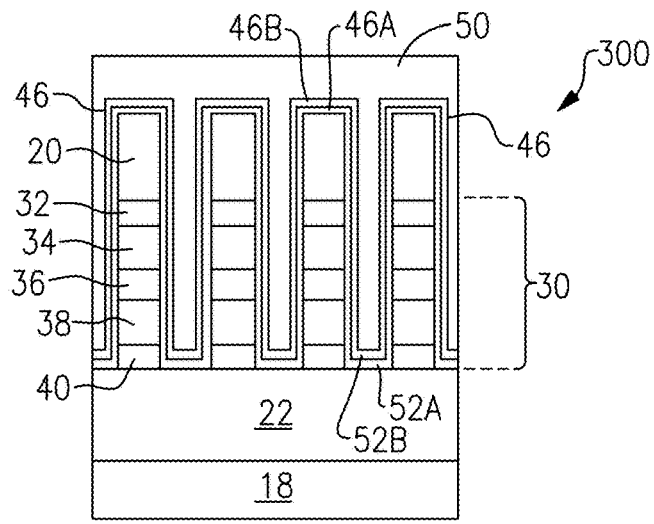
FIGS. 3A and 3B illustrate an example cross-point memory array having a plurality of memory cells having sidewalls lined with an encapsulation layer, viewed in a y-direction and a x-direction, respectively, according to embodiments.
Figure 3A:
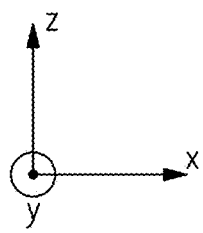
Figure 3B:
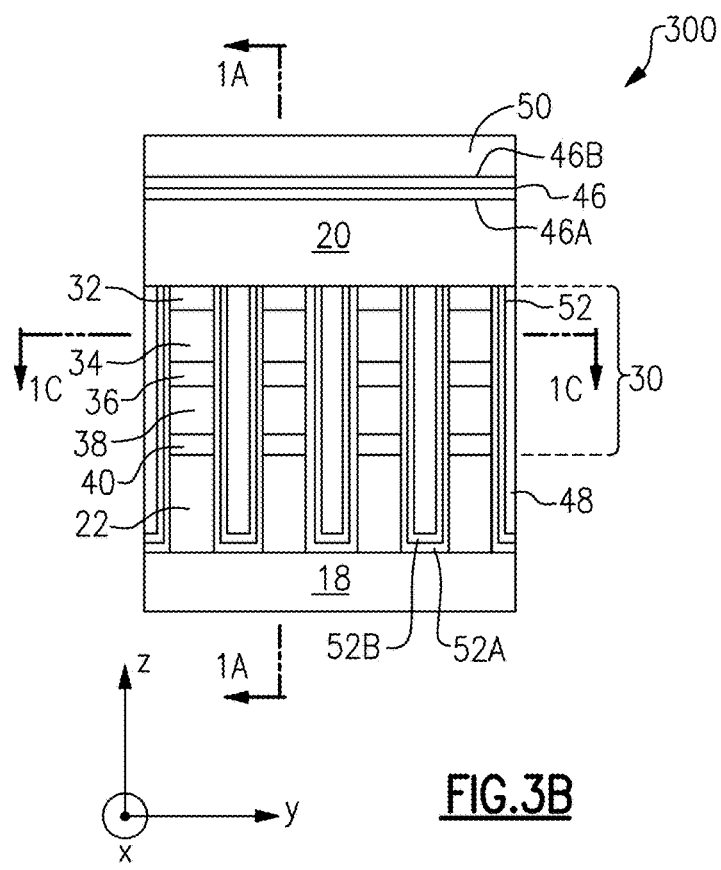
Figure 3B:
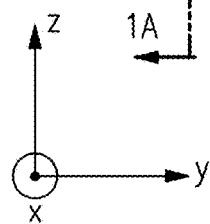

To address the needs of preventing degradation of the PCM device 100 as discussed above, the inventors have discovered a need to protect one or both of the phase change storage element 34 and the selector element 38 with an encapsulating layer to provide protection from moisture, air, or other impurities during fabrication and/or operation thereof. FIGS. 3A and 3B illustrate an example cross-point memory array 300 formed on a semiconductor substrate 18, viewed in a y-direction and a x-direction, respectively. The cross-point array 300 comprises a plurality of memory cells 30 having sidewalls lined with an encapsulation, according to embodiments. Each of the memory cells 30 is disposed vertically between a first conductive line 20, e.g., one of a wordline or a bitline, extending in a first direction, and a second conductive line 22, e.g., the other of the wordline or the bitline, extending in a second lateral direction crossing the first lateral direction. Each of the memory cells 30 has formed on one or both sidewalls thereof an encapsulation layer 46, 52. The encapsulation layers 46, 52 according to embodiments comprise a low-electronegativity (low-χ)

metal oxide layer 46A, 52A, where the metal of the low-χ metal oxide layer 46A, 52A has an electronegativity of 1.6 or lower.

Still referring to FIGS. 3A and 3B, each of the memory cells 30 is a phase change memory cell and is arranged between an upper conductive line 20 extending in the y-direction and a lower conductive line 22 extending in the x-direction. The upper and lower conductive lines 20 and 22 are conductors configured to carry electrical signals such as, for example, a voltage or a current pulse, between memory cells 30 and peripheral circuitry such as driver circuitry and sensing circuitry (not shown). The memory cell 30 includes a selector element 38 and a storage element 34 that are separated by a middle electrode 36. The illustrated memory cell 30 additionally includes a lower electrode 40 between the selector element 38 and the lower conductive line 22 and an upper electrode 32 between the upper conductive line 20 and the phase change storage element 34. It will be appreciated that in some configurations, the positions of the phase change storage element 34 and the selector element 38 may be switched. Furthermore, in some embodiments, one or more of the upper electrode 32, middle electrode 36 and the lower electrode 40 may be omitted.

While not shown for clarity and ease of illustration, it will be understood that the semiconductor substrate 18 may include various structures that have been processed through the front-end-of-line, and can include various peripheral and/or supporting devices, for instance CMOS transistors that form a part of wordline and bitline driver circuitry and sense amplifier circuitry. Furthermore, the semiconductor substrate 18 can include one or more of a variety of structures pre-formed thereon, e.g., diffusion regions, isolation regions, electrodes, and metallization structures such as contacts and metallization lines, to name a few, over which the array 300 may be disposed. Some of these devices and structures may limit a thermal budget of process steps used to fabricate the array 300, as described infra.

The elements of the memory cell 30 are now described in more detail, according to various embodiments. Still referring to FIGS. 3A and 3B, the phase change material of the phase change storage element 34 can include a chalcogenide alloy composition including at least two of elements within the GeSbTe (GST) alloy system, e.g., $Ge_8Sb_5Te_8$, $Ge_2Sb_2Te_5$, $Ge_1Sb_2Te_4$, $Ge_1Sb_4Te_7$, $Ge_4Sb_4Te_7$, etc., or a chalcogenide alloy composition including at least two of elements within the InSbTe (IST) alloy system, e.g., $In_2Sb_2Te_5$, $In_1Sb_2Te_4$, $In_1Sb_4Te_7$, etc., among other chalcogenide alloy systems. The chalcogenide alloy system may further comprise, e.g., be doped with, certain elements such as Si. Other chalcogenide alloy systems that include one or more chalcogenide elements, and are capable of undergoing a phase change directly or indirectly in response to an electrical signal, may be used. A suitable deposition technique may be used to form a thin film layer from which the phase change storage element may be formed. For example, a thin film layer of the phase change material may be deposited using, e.g., physical vapor deposition, chemical vapor deposition and atomic layer deposition, to name a few examples, from which the phase change storage element 34 may be formed by a combination of suitable patterning techniques.

Referring to FIGS. 3A and 3B, upper and/or lower conductive lines 20 and 22 can comprise a metal. Examples of the metal include elemental metals such as Al, Cu, Ni, Cr, Co, Ru, Rh, Pd, Ag, Pt, Au, Ir, Ta, and W; conductive metal nitrides such as TiN, TaN, WN, and TaCN; conductive metal silicides such as tantalum silicides, tungsten silicides, nickel silicides, cobalt silicides and titanium silicides; and conductive metal oxides such as $RuO_2$.

The selector element 38 includes a suitable two terminal or three terminal device that can be used to switch the memory state of the phase change storage element. In some embodiments, the selector device can include a semiconductor device, e.g., a metal-silicon-oxide (MOS) transistor, a bipolar junction transistor (BJT), a silicon-controlled rectifier (a thrystor), a disc, a PN junction diode and a Schottky diode, to name a few. In some other embodiments, the selector device 38 can include an Ovonic threshold switch (OTS), which is a bidirectionally symmetric two terminal switch. Some OTSes include a chalcogenide composition. However, unlike phase change materials of the phase change storage element 34, the chalcogenide materials of OTSes do not crystallize or undergo a phase change. Instead, upon application of a voltage or an electric field exceeding a threshold value thereacross, an OTS may turn on to conduct current therethrough, and upon removal of the voltage or the electric field, the OTS may turn off to block current from conducting therethrough. An OTS may include a chalcogenide composition including any one of the chalcogenide alloy systems described above with respect to the phase change storage element 34 and, in addition, include an element that can suppress crystallization, such as arsenic (As), nitrogen (N) and carbon (C), to name a few. Examples of OTS material systems include Te—As—Ge—Si, Ge—Te—Pb, Ge—Se—Te, Al—As—Te, Se—As—Ge—Si, Se—As—Ge—C, Se—Te—Ge—Si, Ge—Sb—Te—Se, Ge—Bi—Te—Se, Ge—As—Sb—Se, Ge—As—Bi—Te, and Ge—As—Bi—Se systems, among others. Without limitation, examples of chalcogenide alloy systems that can form an OTS include TeAsGeSi, GeTePb, GeSeTe, AlAsTe, SeAsGeSi, SeAsGeC, SeTeGeSi, GeSbTeSe, GeBiTeSe, GeAsSbSe, GeAsBiTe, and GeAsBiSe alloy systems, to name a few. A suitable combination of processing techniques may be used to form a thin film layer from which an OTS may be formed. For example, a thin film layer of the OTS material may be deposited using, e.g., physical vapor deposition, chemical vapor deposition and atomic layer deposition, to name a few examples, from which the selector device may be formed by a combination of suitable patterning techniques.

Still referring to FIGS. 3A and 3B, the upper, middle and lower electrodes 32, 36 and 40 can comprise materials that electrically connect the operational elements of the memory cell but aim to prevent interactions and/or interdiffusion among adjacent materials. For example, depending upon the adjacent materials, suitable electrode materials can include one or more conductive and semiconductive materials such as, for example, carbon (C); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; and conductive metal oxides including $RuO_2$.

Still referring to FIGS. 3A and 3B, in some embodiments, each layer of the memory cell 30 and upper and lower conductive lines 20 and 22 can have lateral dimensions, e.g., widths, in x and y directions, respectively, selected for a particular lithographic technology node and be in the range between about 3 nm and 60 nm, between about 5 nm and 40 nm, or between about 5 nm and 30 nm, depending upon the technology node for the integrated circuit design. Smaller or larger dimensions are yet possible, limited only by the lithographic capability employed by the person skilled in the art. The upper and lower conductive lines 20 and 22 can have lengths in the y and x directions, respectively, selected to be much greater than the widths, such as at least 100 times greater or at least 1000 times greater than the widths.

Referring to FIG. 3A, opposing sidewalls (in the x-direction) of the upper conductive line 20 and first opposing sidewalls (in the x-direction) of the memory cell 30 are lined with a first encapsulating layer 46, and spaces between adjacent upper conductive lines 20 and spaces between adjacent memory cells 30 are filled with a first isolation material 50. Referring to FIG. 3B, opposing sidewalls (in the y-direction) of the lower conductive line 22 and second opposing sidewalls (in the y-direction) of the memory cell 30 are lined with a second encapsulating layer 52, and spaces between adjacent lower conductive lines 22 and spaces between adjacent memory cells 30 are filled with a second isolation material 48.

The first and second encapsulating layers 46 and 52 can advantageously function to protect one or both of the phase change storage element 34 and the selector element 38 from moisture, air, or other impurities during fabrication thereof. The first and second encapsulating layers 46, 52 can further function to minimize cross-contamination and/or material inter-diffusion between various elements of the memory cell 30 and surrounding materials, e.g., neighboring memory cells and isolation materials, during operation thereof.

Encapsulation Layers for Phase Change Memory Cells

As described above, memory cells according to embodiments have formed on sidewalls thereof an encapsulating layer for protecting one or both of the phase change storage element and the selector element from the environment during fabrication and/or operation thereof. In the following, physical and chemical characteristics of the encapsulating layer are described.

Referring back to FIGS. 3A and 3B, one of both of the first and second encapsulating layers 46, 52 comprise an oxide of a low electronegativity metal, or a low-electronegativity (low-$\chi$) metal oxide layer 46A, 52A. As described herein, a low-$\chi$ metal refers to a metal having an electronegativity that is lower than electronegativities of the elements of the phase memory element and/or the selector element in contact with the low-$\chi$ metal oxide layer 46A, 52A. For various phase change materials describe herein, a low-$\chi$ metal has an electronegativity value of about 1.6 or lower. According to embodiments, the electronegativity of the low-$\chi$ metal is lower than about 1.6, 1.5, 1.4, 1.3, 1.2, 1.1, 1.0, 0.9, 0.8, 0.7 or a value in a range defined by any of these values.

According to various embodiments, a low-$\chi$ metal oxide layer 46A, 52A can be an oxide of a metal (M) having an electronegativity lower than 1.6 and being one of a rare earth metal, a transition metal, an alkaline earth metal, or an alkali metal. Thus, the low-$\chi$ metal oxide layer 46A, 52A can be $MO_x$, where M is the low-$\chi$ metal, and $MO_x$ denotes that the oxide layer can be stoichiometric or unstoichiometric. For example, when M is La, the low-$\chi$ metal oxide layer 46A, 52A can be $LaO_x$, where x is greater than zero and equal to or less than 1.5, where a stoichiometric lanthanum oxide is $La_2O_3$.

In some embodiments, the low-$\chi$ metal can be a rare earth metal. The rare earth metal can be one or more of, a lanthanide series element and an actinide series element. The lanthanide series element can be selected from the group consisting of La, Ce, Pr, Nd, Pm, Sm, Eu, Gd, Tb, Dy, Ho, Er, Tm, Yb and Lu. The actinide series element can be selected from the group consisting of Ac, Th, Pu, Am, Cm, Bk, Cf, Es, Fm, Md and No.

In some other embodiments, the low electronegativity metal can be an alkaline earth metal selected from the group consisting of Mg, Ca, Sr, Ba and Ra.

In some other embodiments, the low electronegativity metal can be an alkali metal selected from the group consisting of Li, Na, K, Rb, Cs and Fr.

In some other embodiments, the low electronegativity metal can be a transition metal selected from the group consisting of Sc, Ti, V, Mn, Zn, Y, Zr, Nb, Hf, Ta, and Tl.

Still referring to FIGS. 3A and 3B, the inventors have discovered that, when the low-$\chi$ metal of the low-$\chi$ metal oxide layers 46A, 52A as part of the encapsulating layers 46, 52 has a sufficiently low electronegativity relative to that of oxygen, which has an electronegativity of 3.44, the encapsulating layers 46, 52 not only serves as a diffusion barrier to protect the memory cells 30 during fabrication and operation thereof, but the encapsulating layers 46, 52 can also chemically reduce existing oxides of chalcogenide material that may have already formed. The inventors have discovered that this is because at least some of the elements of the phase change storage element 34 and/or the selector element 38 have electronegativities that are substantially higher than that of the low-$\chi$ metal. At least in part due to a relatively larger difference between the electronegativities of the low-$\chi$ metal and oxygen, relative to the difference between the electronegativities of the phase change storage element 34/the selector element 38 and oxygen, the inventors have discovered that the low-$\chi$ metal of the low-$\chi$ metal oxide can pull oxygen from the oxidized chalcogenide material. Thus, according to embodiments, the low-$\chi$ metal of the low-$\chi$ metal oxide layers 46A, 52A serves to at least partly chemically reduce the oxidized chalcogenide material and reduce the oxygen content thereof when the oxidized chalcogenide material exposed to a low-$\chi$ metal precursor. For this process to occur effectively, the inventors have discovered that it can be critical for the low-$\chi$ metal of the low-$\chi$ metal oxide layers 46A, 52A to have an electronegativity that is about 1.6 or lower.

According to various embodiments, low-$\chi$ metal oxide layers 46A, 52A comprising the metal oxide of a low electronegativity metal has a thickness effective to serve as a barrier and/or to chemically reduce the oxide of the chalcogenide material. On the one hand, the thickness should be sufficiently thick to conformally and continuously cover the targeted sidewalls of the memory cell 30. On the other hand, the thickness should be smaller than ½ of a spacing between adjacent memory cells 30 in respective directions, as depicted in FIGS. 3A and 3B. The inventors have determined that the thickness of the low-$\chi$ metal oxide layers 46A, 52A can be greater than 1 nm, 2 nm, 3 nm, 4 nm, 5 nm, 6 nm, 7 nm, 8 nm, 9 nm, 10 nm or a value in a range defined by any of these values.

The inventors have discovered that, some low-$\chi$ metal oxide layers, under some circumstances, can be hydroscopic and undesirably absorb and/or react with moisture over time. The absorption and/or reaction can result in an increase in the thickness of some low-$\chi$ metal oxide layers. The inventors have further discovered that, under these circumstances, it can be advantageous to form a capping layer as part of one or both of the first and second encapsulating layers 46, 52 to suppress the absorption and/or reaction of the low-$\chi$ metal oxide layers with moisture. Thus, referring back to FIGS. 3A and 3B, in some embodiments, one or both of the first and second encapsulating layers 46, 52 comprise corresponding capping layers 46B, 52B formed on the low-$\chi$ metal oxide layers 46A, 52A, respectively. The inventors have discovered that certain high-K dielectrics to be particularly effective in achieving this purpose.

According to these embodiments, one or both of the first and second encapsulating layers 46, 52 further comprise corresponding capping layers 46B, 52B, where the capping layers comprise a high K dielectric comprising an oxide of Al, Zr, or Hf. For example, the capping layer can include one or more of $Al_2O_3$, $ZrO_2$, and $HfO_2$. The capping layer can also be substoichiometric oxide layers represented as $AlO_x$, $ZrO_x$ and $HfO_x$.

It will be appreciated, when present, the capping layers 46B, 52B have a thickness that is sufficient to conformally and continuously cover the corresponding ones of the low-χ metal oxide layers 46A, 52A. On the other hand, the thickness should be sufficiently small such that the overall thickness of the first and second encapsulating layers 46, 52 is smaller than ½ of a spacing between adjacent memory cells 30 in respective directions, as depicted in FIGS. 3A and 3B. The inventors have determined that the capping layer thickness, when present, does not exceed 0.5 nm, 1 nm, 2 nm, 3 nm, 4 nm, 5 nm or a value in a range defined by any of these values.

Cyclic Deposition of Encapsulation Layers for Phase Change Memory Cells

As described above, memory cells according to embodiments have formed on sidewalls thereof an encapsulating layer for protecting one or both of the phase change storage element and the selector element from the environment during processing and/or operation thereof. Referring back to FIGS. 3A and 3B, in addition to various characteristics described above, one or both of the first and second encapsulating layers 46, 52 are advantageously deposited using a cyclic deposition method as described herein.

Cyclic deposition processes such as atomic layer deposition (ALD) can provide relatively conformal thin films on relatively high aspect-ratio (e.g., 2:1) structures with high uniformity of the thickness with precision. While generally less conformal and uniform compared to ALD, thin films deposited using continuous deposition processes such as chemical vapor deposition (CVD) can provide higher productivity and lower cost. According to embodiments, the spaces formed between lines or pillars of memory cells 30 (FIGS. 3A and 3B), in which the first and second encapsulating layers 46, 52 are formed, have relatively small widths and/or high aspect ratio. For example, the spaces can have a width less than 20 nm, 15 nm, 10 nm, 5 nm or a value in a range defined by any of these values, and have aspect ratios greater than 2, 5, 10, 20 or a value in a range defined by any of these value. Thus, according to embodiments, the first and second encapsulating layers 46, 52 are advantageously formed using a cyclic deposition process, e.g., ALD, as described herein. In particular the cyclic deposition processes according to embodiments are thermal cyclic deposition processes that rely on chemical reaction between precursors that are thermally driven without aid of plasma.

Figure 4:
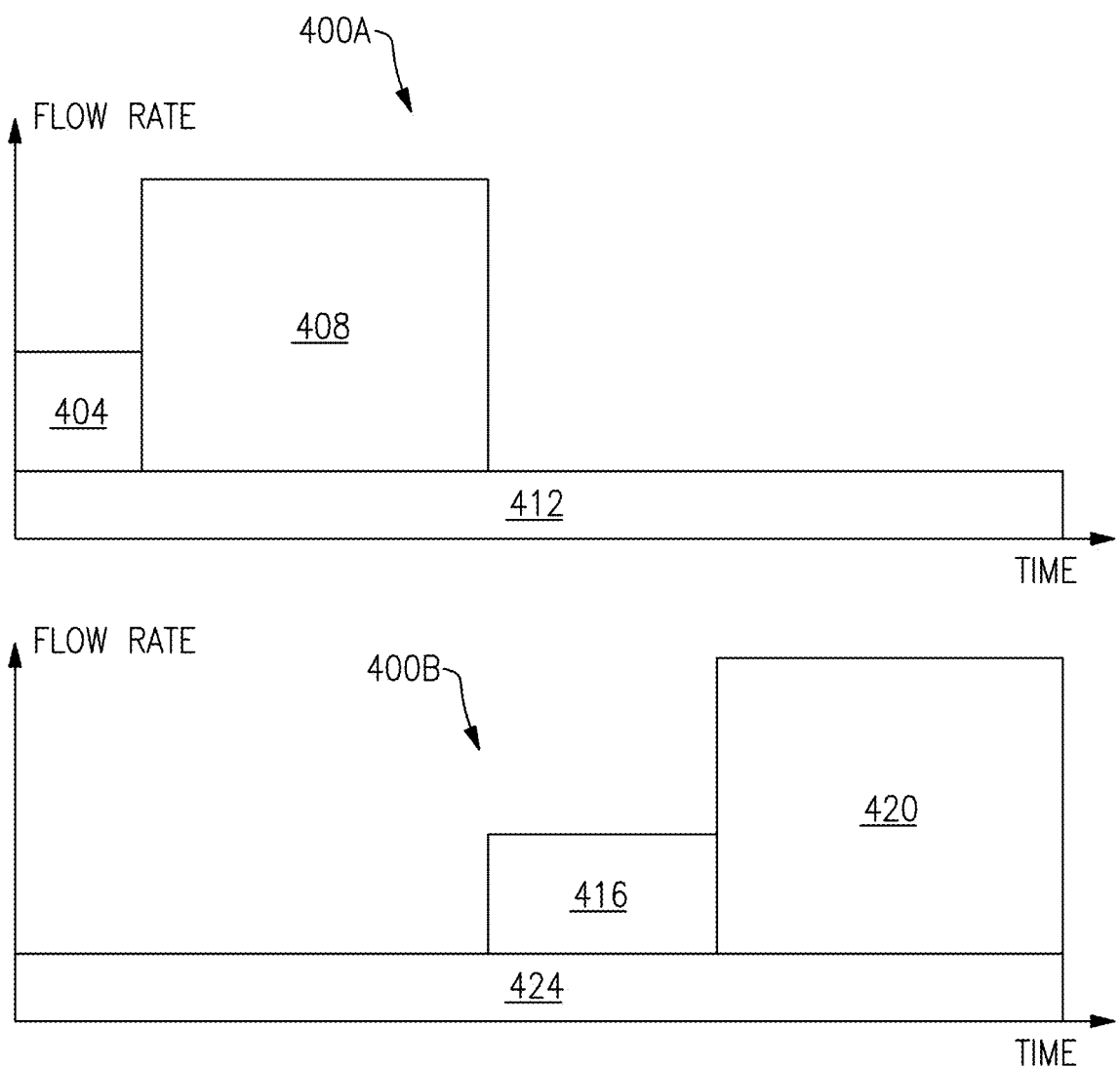
FIG. 4 schematically illustrates an example precursor delivery sequence for forming an encapsulation layer, according to embodiments FIG. 5A schematically illustrates a method of encapsulating a phase change memory cell, according to embodiments.

Cyclic deposition processes including atomic layer deposition (ALD) processes according to embodiments include alternatingly exposing a substrate to a plurality of precursors to form a thin film in a layer-by-layer fashion, to precisely control such properties of the thin film as conformality, uniformity, stress and barrier properties with respect to oxygen, moisture and various other impurities. The reactants or precursors can include oxidizing and reducing reactants that are alternatingly introduced into a reaction chamber having disposed therein a substrate. The introduction of one or more reactants or precursors may be in turn be alternated with a purge and/or a pump out process for removing excess reactants or precursors from the reaction chamber. The precursors or reactants may be introduced into the reaction chamber under a condition over a suitable period of time such that the surface on which the encapsulation layer is to be deposited can become at least partly saturated, e.g., substantially entirely saturated, with the precursors or reactants and/or a reaction product of the reactants. Excess or residual precursors or reactants may then be purged and/or pumped out of the reaction chamber. A pump out process may be performed by a suitable vacuum pumping process and a purge step may be performed by introducing a non-reactive or an inert gas, e.g., nitrogen or a noble gas, into the reaction chamber. FIG. 4 schematically illustrates an example precursor delivery sequence for forming an encapsulation layer, according to embodiments. Referring to FIG. 4, a cyclic deposition or ALD cycle comprises a first subcycle 400A or vapor deposition phase and a second subcycle 400B or vapor deposition phase. The first subcycle 400A in turn includes an exposure 404 of the substrate to the first precursor, and the second subcycle 400B in turn includes an exposure 416 of the substrate to the second precursor. The first subcycle 400A may be performed through a first ALD precursor delivery line including a first ALD valve, and the second subcycle 400B may be performed through a second ALD precursor delivery line including a second ALD valve.

In some embodiments, one or both of the first subcycle 400A and the second subcycle 400B includes a respective continuous purge 412, 424 using an inert gas, e.g., Ar or $N_2$. In some embodiments, one or both of the first and second subcycles 400A, 400B comprise respective rapid purges 408, 420 using an inert gas following the exposure to one or both of the first and second precursors, respectively. The rapid purges 408, 420 may be performed at higher flow rates than those of the continuous purges 412, 424. In some other embodiments, one or both of the continuous purge and the rapid purge may be omitted from one or both of the first and second subcycles 400A, 400B. In these embodiments, instead of a rapid purge, the precursors may be pumped out without a purge gas. It will be appreciated that the illustrated precursor delivery sequences may schematically represent sequences for forming one or both of the low-χ metal oxide layer 46A, 52A (FIGS. 3A, 3B) and the capping layer 46B, 52B (FIGS. 3A, 3B), as described above. In the following, a deposition method for forming the low-χ metal oxide layer 46A, 52A of the encapsulation layer 46, 52 is described first, followed by a deposition method for forming the capping layer 46B, 52B.

Figure 5A:
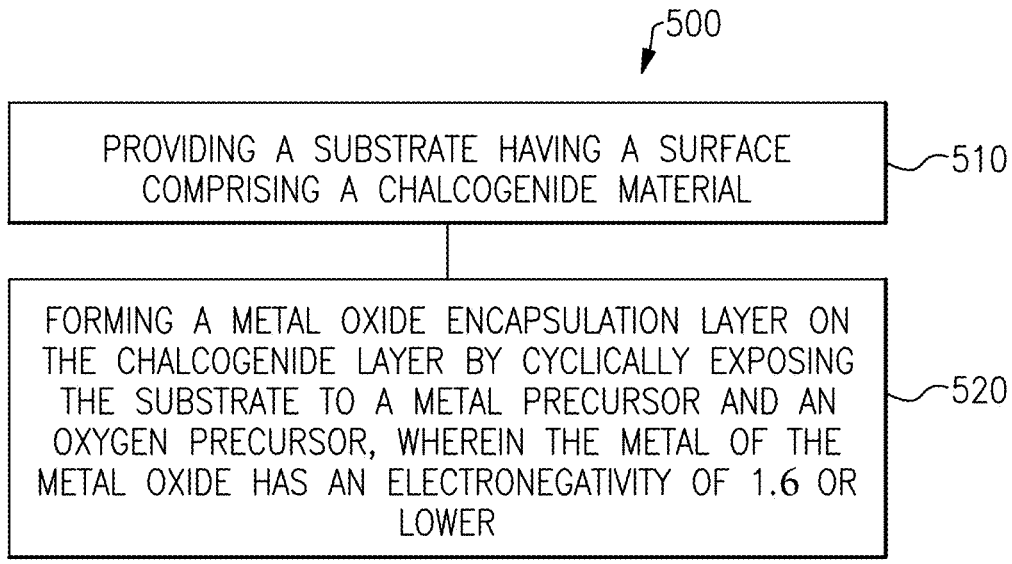
FIG. 5B schematically illustrates a method of forming an encapsulation layer as part of the method of encapsulating illustrated in FIG. 5A.
Figure 5B:
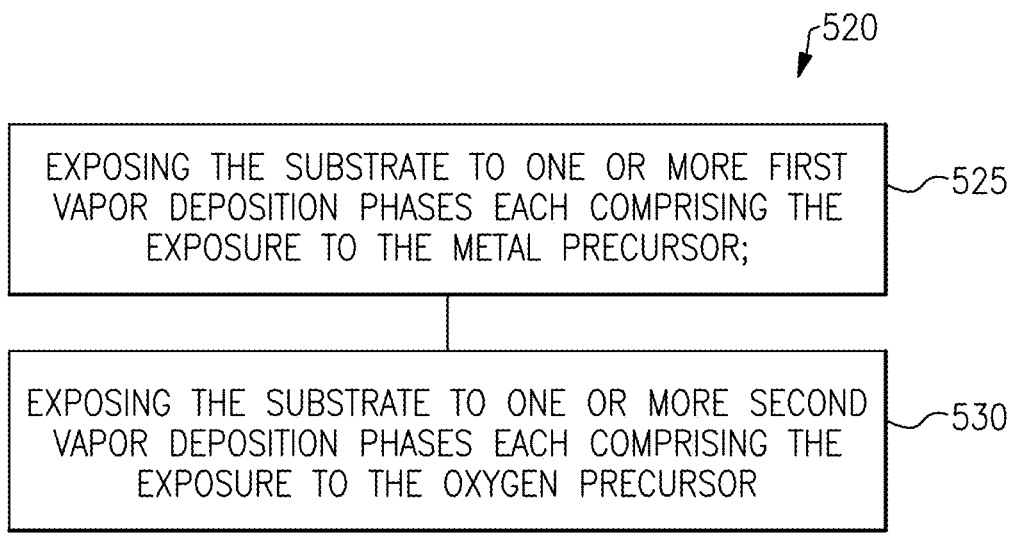

FIG. 5A schematically illustrates a method of fabricating a phase change memory cell, according to embodiments. The method 500 includes providing a substrate and forming an encapsulation layer. FIG. 5B schematically illustrates a method of forming the encapsulation layer as part of the method illustrated in FIG. 5A.

Referring to FIG. 5A, the method 500 of fabricating a phase change memory cell comprises providing 510 a substrate having an exposed surface comprising a chalcogenide layer. The method 500 additionally comprises forming 520 an encapsulation layer comprising a low-χ oxide layer on the chalcogenide layer by cyclically exposing the substrate to a low-χ metal precursor and an oxygen precursor, e.g., $O_2$, wherein the low-χ metal of the low-χ metal oxide layer has an electronegativity of 1.6 or lower. Referring to FIG. 5B, forming 520 the encapsulation layer comprises exposing 525 the substrate to one or more first subcycles 400A or vapor deposition phases (FIG. 4) each comprising the exposure to the low-χ metal precursor, and exposing 530 the substrate to one or more second subcycles 400B or vapor deposition phases (FIG. 4) each comprising the exposure to the oxygen precursor.

Referring to FIG. 5A, providing 510 the substrate comprises providing a semiconductor substrate 18 (FIGS. 3A and 3B) having a surface comprising a chalcogenide material. For example, providing the substrate can include lithographically patterning a layer stack to expose the sidewalls of the memory cells 30 (FIGS. 3A, 3B) prior to forming one or both of the first and second encapsulating layers 46, 52. The exposed sidewalls may expose one or both of the phase change memory element 34 and the selector element 38. Forming 520 the encapsulation layer comprises forming at least a low-$\chi$ metal oxide layer, as described below.

Referring to FIG. 5B, in various embodiments, exposing 525 the substrate to each of the one or more first deposition phases comprises subjecting the substrate to one or more exposures to the low-$\chi$ metal precursor, and one or more exposures to the oxygen precursor. Each exposure to the low-$\chi$ metal precursor is such that, after exposure, the substrate surface can become substantially or partly saturated with the metal precursor. After exposing the substrate to the low-$\chi$ metal precursor, excess or residual metal precursor and/or its reaction products that do not remain adsorbed or chemisorbed on the surface of the substrate may be removed from the substrate surface, such as by having the process chamber pumped and/or purged out. Each exposure to the oxygen precursor is such that, after exposure, the substrate surface can become substantially or partly saturated with the oxygen precursor. After exposing the substrate to the oxygen precursor, excess or residual oxygen precursor or its reaction products that do not remain adsorbed or chemisorbed on the surface of the substrate may be removed from the substrate surface, such as by having the process chamber pumped or purged out. Subjecting the substrate to one or more first deposition phases and second deposition phases may form one or more monolayers or a region formed substantially of a low-$\chi$ metal oxide.

In some embodiments, the exposure to the low-$\chi$ metal precursor in a given first deposition phase may be performed a plurality of times in sequence. Similarly, the exposure to the oxygen precursor in a given second deposition phase may be performed a plurality of times in sequence. Advantageously, under some circumstances, exposing the substrate to the low-$\chi$ metal and/or oxygen precursors more than once may result in a higher level of surface saturation, e.g., when substantial stearic hindrance effect exists, by exposing more reactive sites for the respective precursor adsorption.

It will be appreciated that, in various embodiments, the number of cycles each including one or both of the first and second deposition phases, the frequency and number of repetition of the first deposition phases and the frequency and number of repetition of the second deposition phases, the frequency and the number of repetition of the exposures of the substrate to the low-$\chi$ metal precursor during the first deposition phases, and the frequency and the number of repetition of the exposures of the substrate to the oxygen precursor during the second deposition phases as described herein, can be varied to obtain a desired thickness, stoichiometry and other properties described herein in the resulting low-$\chi$ metal oxide layer and the resulting encapsulation layer, based on various considerations including susceptibility to stearic hindrance effects of the precursors.

As described above, the inventors have found that, a low-$\chi$ metal can be effective at chemically reducing a chalcogenide oxide material or reducing the oxygen content therefrom. In these embodiments, the inventors have found that it can be particularly advantageous to initiate the deposition of one or both of the first and second low-$\chi$ metal oxide 46A, 52A with a low-$\chi$ metal precursor. In these embodiments, referring to FIG. 5B, exposing 525 the substrate to one or more first vapor deposition phases each comprising an exposure to the low-$\chi$ metal precursor precedes any of exposing 530 the substrate to one or more second vapor deposition phases each comprising an exposure to the oxygen precursor. Exposing the substrate to the low-$\chi$ metal precursor as the first precursor can effectively provide the low-$\chi$ metal atoms in proximity to the underlying oxidized chalcogenide material for chemically reacting with oxygen atoms of the oxidized chalcogenide material.

Alternatively, in some embodiments, forming the low-$\chi$ metal oxide layers 46A, 52A as substoichiometric oxide layers can have a similar effect of chemically reducing a chalcogenide oxide material or reducing the oxygen content therefrom. In these embodiments, the low-$\chi$ metal oxide layers 46A, 52A of the first and second encapsulating layers 46, 52, respectively, can be at least 10%, 20%, 30%, 50% deficient in oxygen content relative to a stoichiometric oxide, or have a deficiency value in a range defined by any of these values.

For depositing a low-$\chi$ metal oxide layer 46A, 52A (FIGS. 3A, 3B) according to embodiments, the following metal and oxygen precursors can be used as non-limiting examples.

Non-limiting examples of a Sr precursor include bis (2,2,6,6-tetramethyl-3,5-heptanedionate) strontium ("Sr (tmhd)$_2$") to name a few.

Non-limiting examples of a La precursor include tris-isopropylcyclopentadienyl lanthanum ("La(iPrCp)$_3$"), lanthanum tris-formamidinate ("La(fAMD)$_3$"), and tris (2,2,6, 6-tetramethyl-3,5-heptanedionate) lanthanum ("La(tmhd) $_3$") to name a few.

Non-limiting examples of a Ti precursor include TiCl$_4$, StarTi, tetrakis-dimethylamino titanium ("TDMAT"), tetrakis-diethylamino titanium ("TDEAT"), tetrakis-ethylmethylamino titanium ("TEMAT"), titanium tetrakis-isopropoxide ("TTIP"), titanium methoxide, titanium ethoxide, titanium t-buthoxide, chlorotriisopropoxytitanium, titanium 2-ethylhexyloxide and titanium oxyacetylacetonate.

A non-limiting example of a Nb precursor includes tert (butylimido)tris(diethylamido) niobium(V) ("TBTDENb").

Non-limiting examples of a Ta precursor include tertiary-butyl imido tris-diethyl tantalum ("TBTDETa"), and tertiary-butyl imido tris-ethylmethylamino tantalum ("TBITEMATa"), to name a few.

Non-limiting examples of a Mg precursors include bis-ethylcyclopentadienyl magnesium ("Mg(CpEt)$_2$"), tetra(2,2, 6,6-tetramethyl-3,5-heptanedionate) magnesium ("Mg$_2$ (tmhd)$_4$"), and Mg(tmhd)$_2$(EtOH)$_2$, to name a few, where tmhd=2,2,6,6-tetramethyl-3,5-heptanedionate.

Non-limiting examples of a Ce precursor include Ce(iP-rCp)$_3$, Ce(tmhd)$_4$ and Ce(tmhd)$_3$phen, where iPrCp=isopropylcyclopentadienyl, tmhd=2,2,6,6-tetramethyl-3,5-heptanedionate, phen=1,10-phenanthroline, to name a few.

Non-limiting examples of a Gd precursor include tris(2, 2,6,6-tetramethyl-3,5-heptanedionate) gadolinium ("Gd (tmhd)$_3$"), tris-isopropylcyclopentadienyl gadolinium ("Gd (iPrCp)$_3$"), (tris(2,3-dimethyl-2-butoxy)gadolinium(III)) ("Gd[OC(CH$_3$)$_2$CH(CH$_3$)$_2$]$_3$"), and Gd(CpCH$_3$)$_3$, where Cp=cyclopentadienyl (C$_5$H$_5$).

A non-limiting example of a Dy pre cursor includes Dy(tmhd)$_3$, where tmhd=2,2,6,6-tetramethyl-3,5-heptanedionate.

A non-limiting example of an Er precursor includes Er(tmhd)$_3$, where tmhd=2,2,6,6-tetramethyl-3,5-heptanedionate.

Non-limiting examples of an Y precursor include yttrium tris(N,N'-diisopropylacetamidinate) ("Y(iPr$_2$amd)$_3$"), (CpCH$_3$)$_3$Y were Cp=cyclopentadienyl, tris (2,2,6,6-tetramethyl-3,5-heptanedionate) yttrium ("Y(tmhd)$_3$"), to name a few.

Non-limiting examples of a Sc precursor include tris (2,2,6,6-tetramethyl-3,5-heptanedionate) Scandium (Sc (tmhd)$_3$), Sc(MeCp)$_3$, Sc(MeCp)$_2$(Me$_2$pz) (1, MeCp=methylcyclopentadienyl, Me$_2$pz=3,5-dimethylpyrazolate).

According to various embodiments, non-limiting examples of the oxygen precursor for forming the first and second low-χ metal oxide layers 46A, 52A include O$_2$, O$_3$ and H$_2$O. The inventors have discovered that, depending on the circumstances, one of the oxygen precursors can be preferred over others of the oxygen precursors. For example, the inventors have discovered that, while O$_3$ can generally provide higher growth rate and higher film density, it can detrimentally lead to additional oxidation of the chalcogenide material of one or both of the phase change storage element and the selector element. As a result, in a preferred embodiment, O$_2$ may be employed to limit undesirable oxidation of the chalcogenide material of one or both of the phase change storage element and the selector element. Limiting undesirable oxidation can be critical, e.g., when lateral dimensions of the memory cells are scaled to less than 20 nm. At these dimensions, the effective amount of the chalcogenide material available for either storage or threshold switching can be significantly reduced by oxidation of the chalcogenide material. On the other hand, when additional oxidation is not a significant concern, e.g., for memory cells having relatively large dimensions, e.g., >20 nm, O$_3$ may be employed for higher film quality and productivity.

For depositing a capping layer 56B, 52B (FIGS. 3A, 3B) according to embodiments, the following metal and oxygen precursors can be used as non-limiting examples.

A non-limiting example of an Al precursor includes Al(CH$_3$)$_3$ ("TMA").

Non-limiting examples of a Hf precursor include Hf[N(CH$_3$)(C$_2$H$_5$)]$_4$ ("TEMAH") and Hf[N(CH$_3$)$_2$]$_4$.

Non-limiting examples of a Zr precursor include Zr[N(CH$_3$)(C$_2$H$_5$)]$_4$ ("TEMAZ"), Zr[N(CH$_3$)(C$_2$H$_5$)]$_4$ ("TEMAZ"), and Zr[N(CH$_3$)$_2$]$_4$, and Zr[N(CH$_3$)$_2$]$_4$.

Non-limiting examples of the oxygen precursor for forming the capping layer include O$_2$, O$_3$ and H$_2$O. The inventors have discovered that, because the capping layer 46B, 46B (FIGS. 3A, 3B), when present, is formed on a low-χ metal oxide layer 46A, 52A (FIGS. 3A, 3B) that is already formed on a chalcogenide material, using O$_3$ may not lead to substantial further oxidation of the chalcogenide material. Thus, O$_3$ may be preferred for depositing the capping layer higher growth rate and higher film density under some circumstances, e.g., when the thickness of the low-χ metal oxide layer 46A, 52A exceeds 2 nm. However, O$_2$ may be employed, e.g., when the first and second low-χ metal oxide layers 46A, 52A are relatively thin, e.g., thinner than 2 nm, such that further oxidation of the chalcogenide material of one or both of the phase change storage element and the selector element may still occur despite the presence of the low-χ metal oxide layer 46A, 52A.

Advantageously, the low-χ metal oxide layers 46A, 52A (FIGS. 3A, 3B) and capping layers 46B, 52B (FIGS. 3A, 3B) may be formed at relatively low temperatures. For protecting chalcogenide materials as disclosed herein, low temperature deposition can be important for several reasons. For example, the encapsulation layers 46, 52 (FIGS. 3A, 3B) may advantageously be performed at a deposition temperature that does not exceed the thermal budget for most back-end-of-line (BEOL) part of the process flow for fabricating the PCM memory device. For some PCM devices, the thermal budget can be as low as 400° C. or below to prevent degradation of metallization structures and/or alter characteristics of diffused semiconductor regions or devices formed in the substrate, as described above. Furthermore, when formed after forming a phase change storage element, the encapsulation layer 46, 52 may advantageously be formed at a deposition temperature that does significantly change the nanostructure or microstructure of, e.g., crystallize the phase change storage element. When it is advantageous for the phase change storage element to maintain an amorphous phase throughout the fabrication process flow, the low deposition temperature of the encapsulation layers 46, 52 can suppress substantial crystallization of the phase change storage element. In these embodiments, the deposition temperature may be lower than a crystallization temperature of the phase change storage element. Maintaining an amorphous phase of the phase change storage element throughout the fabrication flow may be advantageous in some circumstances, e.g., for reliability testing of the phase change memory device after fabrication without incurring prohibitive test current. To realize these and other advantages, the low-χ metal oxide layers 46A, 52A and the capping layers 46B, 52B may be formed at a substrate temperature of 200° C.-250° C., 250° C.-300° C., 300° C.-350° C., 350° C.-390° C., 350° C.-400° C., or a temperature in a range defined by any of these values, for instance about 285° C., according to embodiments.

Method of Lining Sidewalls of Phase Change Memory Cells with Encapsulation Layers In the following, by way of example, an integration scheme for fabricating a phase change memory device including memory cells encapsulated according to embodiments is described. FIGS. 6A-6H illustrate intermediate structures at various stages of fabricating a cross-point array having encapsulated phase change memory cells, according to embodiments, to arrive at the array 300 (FIGS. 3A, 3B). FIGS. 6A, 6C, 6E and 6G represent cross-sectional views of intermediate structures of a cross-point memory array at various stages of fabrication, viewed in a y-direction (e.g., a digit line direction), and FIGS. 6B, 6D, 6F and 6H represent cross-sectional views of intermediate structures of the cross-point array, viewed in an x-direction (e.g., a word line direction).

Figure 6A:
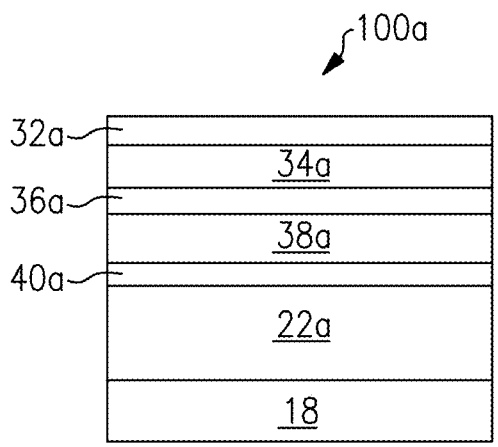
FIGS. 6A-6H illustrate intermediate structures at various stages of fabricating a cross-point array having encapsulated phase change memory cells, according to embodiments.
Figure 6A:
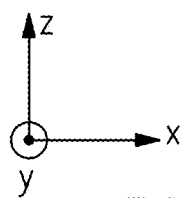
Figure 6B:
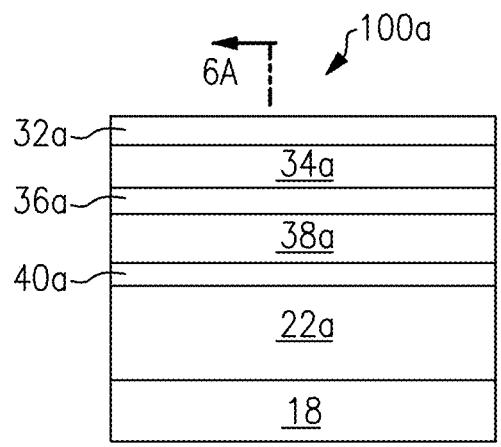
Figure 6B:
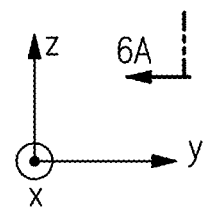

Referring to an intermediate structure 100a illustrated in FIGS. 6A and 6B, the method of fabricating a memory array includes forming a memory cell material stack on a substrate 18. The illustrated stack includes a lower conductive material 22a formed over the substrate 18, and the memory cell material stack formed thereover, including a lower electrode material 40a on the lower conductive material 22a, a selector element material 38a on the lower electrode material 40a, a middle electrode material 36a on the selector element material 38a, a phase change storage element material 34a on the middle electrode material 36a, and an upper electrode material 32a on the phase change storage element material 34a. The foregoing features of the lower conductive material 22a and the memory cell material stack may be formed, for example, by deposition techniques such as physical deposition (PVD), chemical vapor deposition (CVD), and atomic layer deposition (ALD), among other deposition techniques.

Figure 6C:
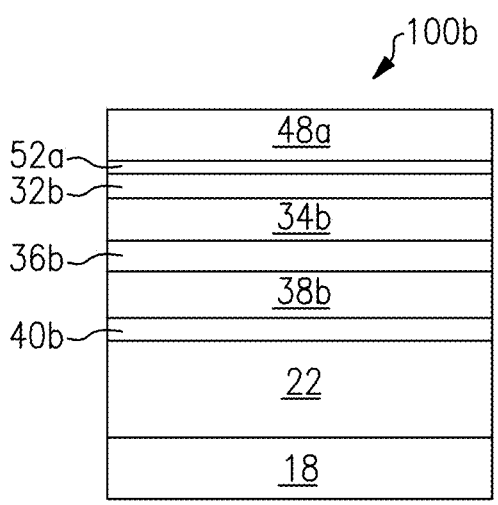
Figure 6C:
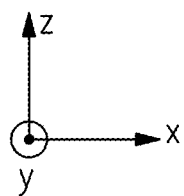
Figure 6D:
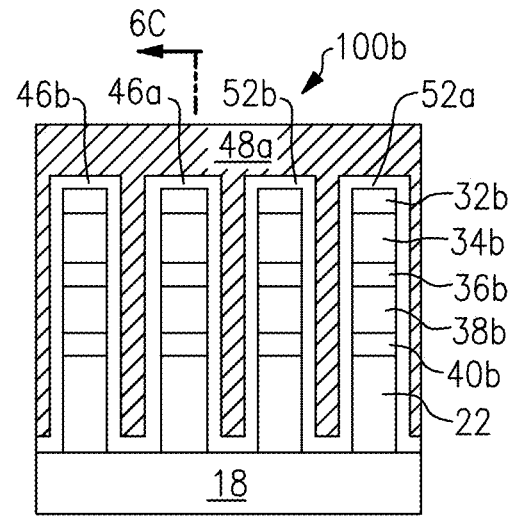
Figure 6D:
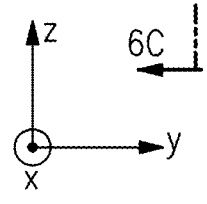

Referring to an intermediate array structure 100b of FIGS. 6C and 6D, the method of fabricating the memory array additionally includes subtractively patterning the memory cell material stack and the lower conductive material 22a (FIGS. 6A and 6B) to form memory cell line stacks on a lower conductive lines 22, both extending in the x-direction, by patterning using a first photo mask and a first etch process. The memory cell line stacks include a lower electrode line 40b on the lower conductive line 22, a first active element line 38b (e.g., a storage element line) on the lower electrode line 40b, a middle electrode line 36b on the first active element line 38b, a second active element line 34b (e.g., a storage element line) on the middle electrode line 36b, and an upper electrode line 32b on the second active element line 34b.

Still referring to intermediate array structure 100b of FIGS. 6C and 6D, after forming the memory cell line stacks, an encapsulation layer 52a is formed on the line stacks extending in the x-direction, including the sidewalls thereof, as illustrated in FIG. 6D. The first encapsulation layer 52a can include one or both of a low-$\chi$ metal oxide layer and a capping oxide layer each formed using thermal cyclic deposition as described above. It will be appreciate that, at advanced technology nodes, e.g. 20 nm and beyond, thermal cyclic deposition processes, e.g., thermal ALD, may be particularly be advantageous for application of the encapsulation layer 52a inside the high aspect ratio trenches between the memory cell line stacks.

Still referring to the intermediate array structure 100b of FIGS. 6C and 6D, inter-line spaces between adjacent memory cell line stacks are filled with a dielectric material to form isolation dielectric regions 48a. Suitable dielectric materials to fill the spaces can include, for example, silicon oxide and silicon nitride, which may be deposited by a suitable gap-filling process known in the art. Once the inter-line spaces between adjacent memory cell line stacks are filled, the intermediate array structure 100b can be chemical-mechanically polished (not shown) to form the memory cell line stacks and isolation dielectric regions 48a that alternate in the y-direction.

Figure 6E:
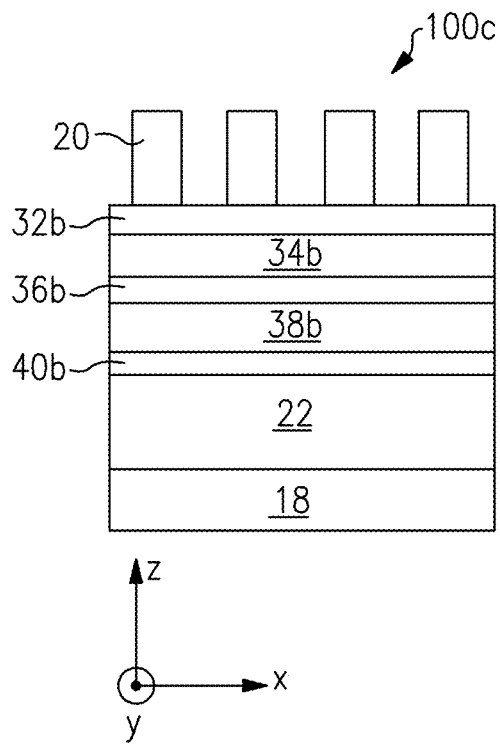
Figure 6F:
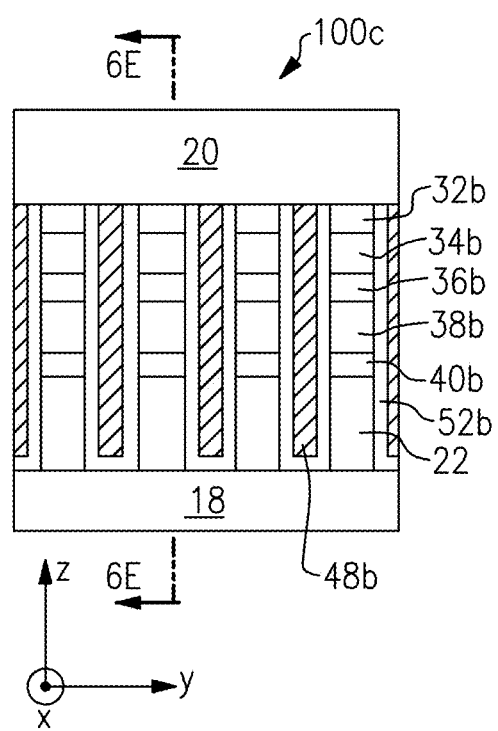

Referring an intermediate array structure 100c of FIGS. 6E and 6F, the method of fabricating the memory array additionally includes depositing an upper conductive material and subtractively patterning using a second photo mask to form a plurality of upper conductive lines 20 extending in the y-direction. The upper conductive material can comprise similar or the same material as the lower conductive line 22 and can be formed using substantially similar or the same processes as discussed above for forming the lower conductive line 22. Thus formed, the plurality of upper conductive lines 20 are disposed on the alternating memory cell line stacks and the isolation dielectric regions 48b, wherein the upper conductive lines 20 extend in the y-direction to cross the memory cell line stacks extending in the x-direction. Forming the upper conductive lines 20 exposes portions of the upper electrode lines 32b of the alternating line stacks, as seen from FIG. 6E, and portions of the initial isolation dielectric regions 48b between adjacent upper conductive lines 20.

Figure 6G:
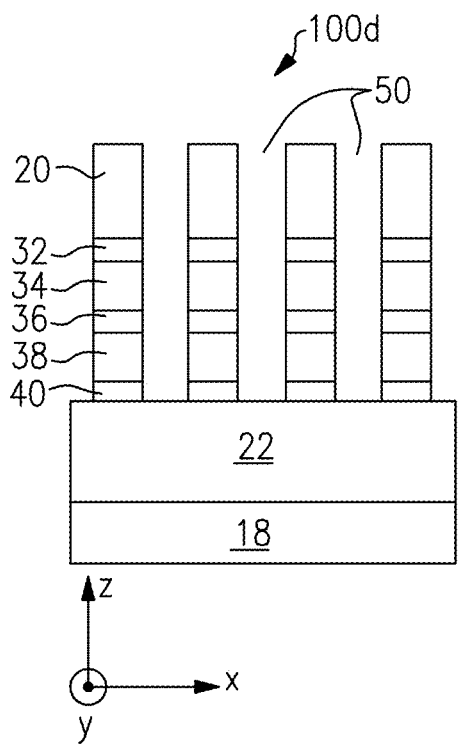
Figure 6H:
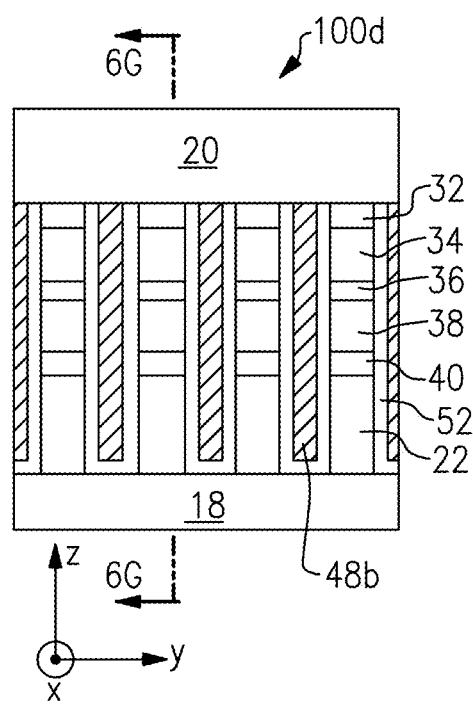

Referring to an intermediate structure 100d of FIGS. 6G and 6H, the method of forming the memory array further includes removing at least upper portions of the exposed portions of the memory cell line stacks of FIGS. 6E and 6F to form pillars of memory cells at intersections of the lower conductive lines 22 and the upper conductive lines 20. In the illustrated embodiment, entire exposed portions (upper and lower portions) of the memory cell line stacks are removed by stopping the etch at the lower conductive lines 22 (or at an etch stop layer thereover) such that the resulting pillars include the upper electrode 32, the phase change storage element 34, the middle electrode 36, the selector element 38, and the lower electrode 40. In other embodiments, the etch can be stopped after etching any layer above the lower conductive lines 22 such that any one of the cell stack component layers, e.g., the lower electrode 40 or the first active element 38 can form a line similar to the lower electrode line 22. Thus formed intermediate structure 100d includes the pillars of memory cells formed at intersections between the lower conductive lines 22 and the upper conductive lines 20 that are separated by spaces 50 in the x-direction.

After forming the pillars of memory cells between the lower and upper conductive lines 22 and 20, the method of forming the memory array includes forming a second encapsulation layer 46 on sidewalls of the pillars as illustrated in FIG. 6G, followed by filling the gaps formed between the pillars with an isolation material 50, to arrive at the intermediate structure 300 described above with respect to FIGS. 3A and 3B. Similar to the first encapsulation layer 52, the second encapsulation layer 46 can also include one or both of a low-$\chi$ metal oxide layer 46A and a capping oxide layer 46B formed using thermal cyclic deposition processes as described above. A thermal cyclic deposition processes, e.g., thermal ALD, may be particularly be advantageous for application of the encapsulation layer 46 inside high aspect ratio trenches between memory cell pillars. In subsequent processes, the intermediate structure 300 may be chemical-mechanically polished to remove the isolation material 50 above the top surfaces of the upper conductive lines 20, before forming BEOL metallization structures to electrically connect the memory cells 30. Thus formed, the combination of the encapsulation layers 46 and 52 may surround the memory cells 30 to fully encapsulate in all directions.

Experimental Examples

Figure 7A:
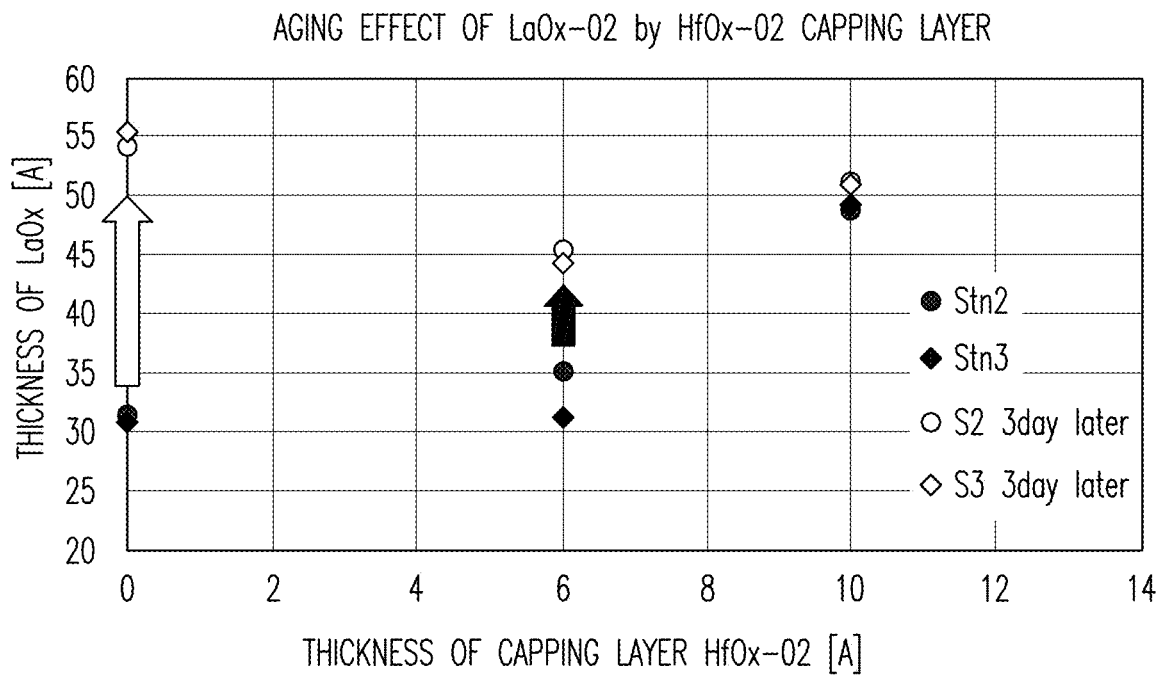
FIG. 7A is a graph illustrating experimentally measured changes in the thickness of a lanthanum oxide layer upon aging, as a function of the thickness of a hafnium oxide capping layer formed thereon, according to embodiments.
Figure 7B:
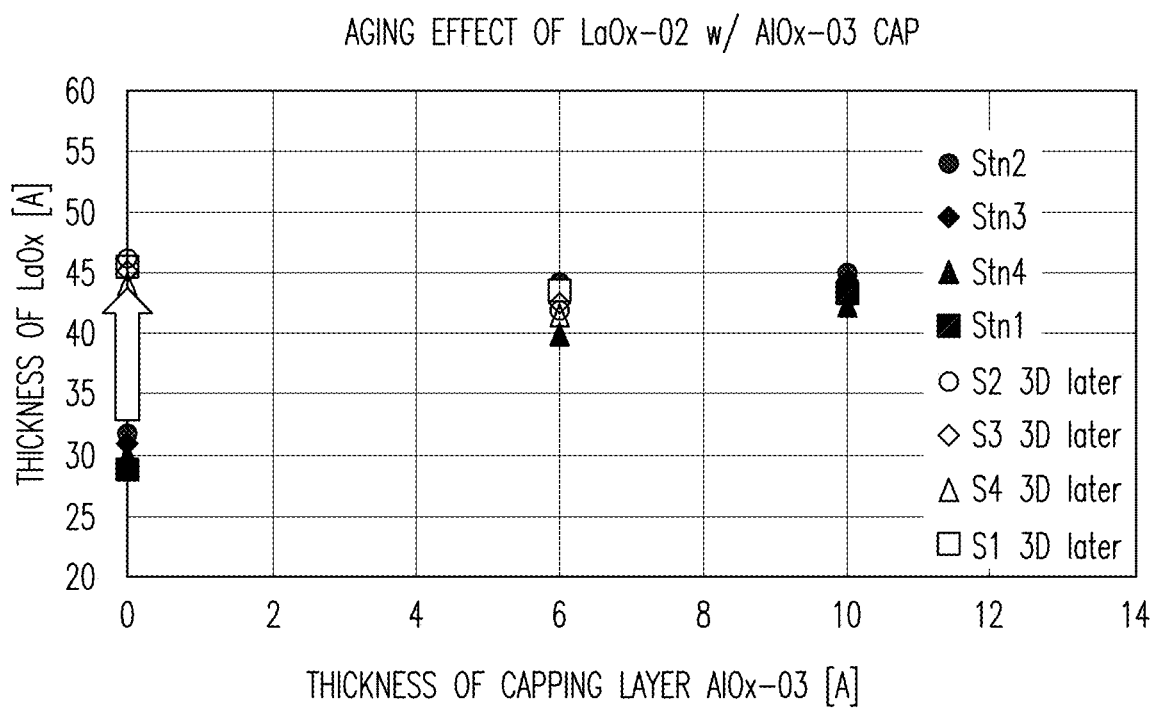
FIG. 7B is a graph illustrating experimentally measured changes in the thickness of a lanthanum oxide layer upon aging, as a function of the thickness of an aluminum oxide capping layer formed thereon, according to embodiments.

FIG. 7A is a graph illustrating experimentally measured changes in the thickness of a lanthanum oxide layer upon aging, as a function of thickness of a hafnium oxide capping layer formed thereon, according to embodiments. As described above, an increasing thickness with aging can be an indicator of absorption and/or reaction of a low-$\chi$ oxide layer with moisture from the environment. FIG. 7B is a graph illustrating experimentally measured changes in thickness of a lanthanum oxide layer upon aging, as a function of thickness of an aluminum oxide capping layer formed thereon, according to embodiments. In FIGS. 7A and 7B, the x-axes represent the thicknesses of the capping layer, and the y-axes represent the thicknesses of the underlying low-$\chi$ metal oxide layer. For each of experimental measurements illustrated in FIGS. 7A and 7B, a lanthanum oxide layer was deposited as the low-$\chi$ metal oxide layer of the encapsulation layer with varying amounts of a capping layer, and a change in the thickness of the lanthanum layer, which the inventors have determined to be correlated to absorption and/or reaction with moisture, was measured. The arrows show the magnitude of change in the thickness of the lanthanum oxide layer. The lanthanum oxide layer was deposited using 1M tris(isopropylcyclo pentadienyi)lanthanum (La(iPrCp)$_3$) in decalin as the low-$\chi$ precursor and O$_2$ as the oxygen precursor, using Eugenus QXP-8300® ALD system. For samples having hafnium oxide and aluminum oxide layers, 6 Å and 10 Å of each of the hafnium oxide and aluminum oxide layers were deposited, in situ, at 285° C.

using the same QXP-8300® ALD system using TEMAH and TMA as metal precursors, respectively, to protect the underlying lanthanum oxide layers from moisture in air. As shown, a lanthanum oxide layer without a capping layer formed thereon increased in thickness by more than 50% relative to the original thickness. In contrast, 6< of hafnium oxide and aluminum oxide capping layers were shown to significantly suppress the thickness increase. 10 Å of hafnium oxide and aluminum oxide capping essentially preserved the thickness of the lanthanum oxide layer within experimental error.

Figure 8A:
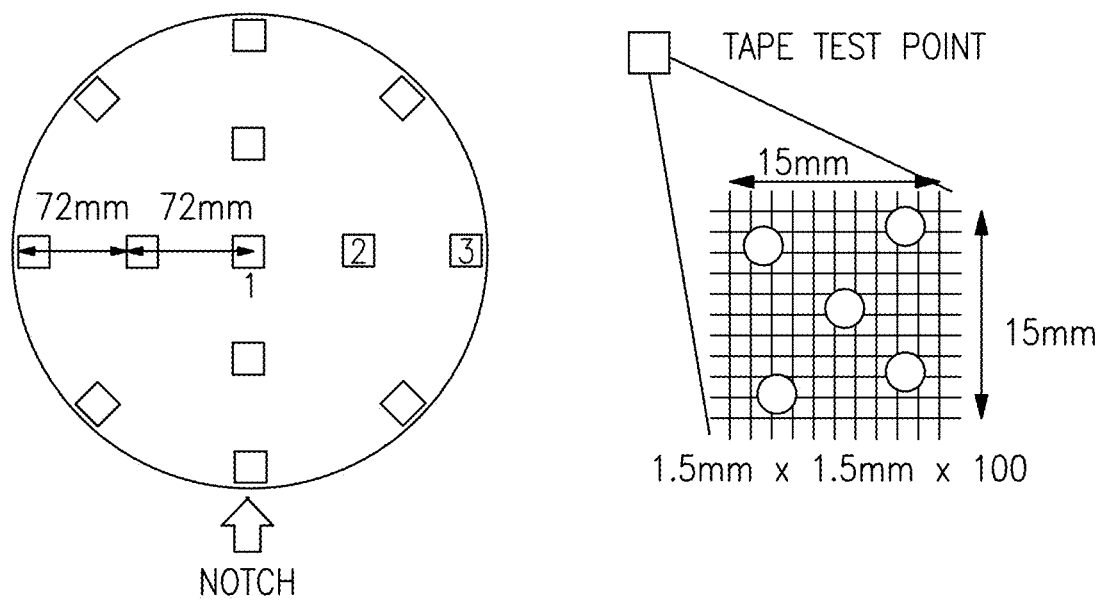
FIG. 8A illustrates a wafer map showing locations where an experimental adhesion strength test of the encapsulation layer according to embodiments has been performed.
Figure 8B:
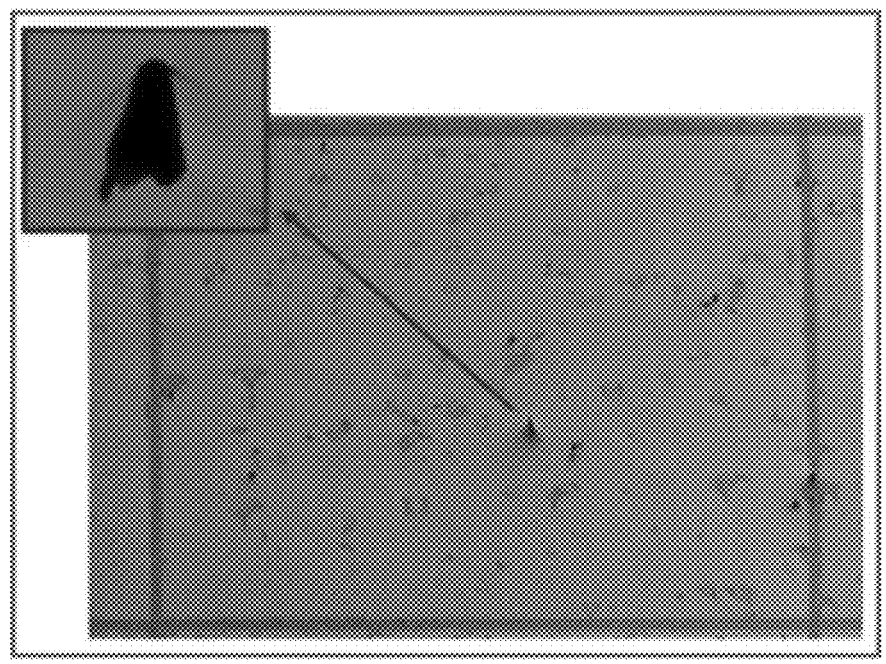
FIG. 8B shows a scanning electron micrograph (SEM) of one of the locations shown in FIG. 8A where an adhesion strength test has been performed.
Figure 8C:
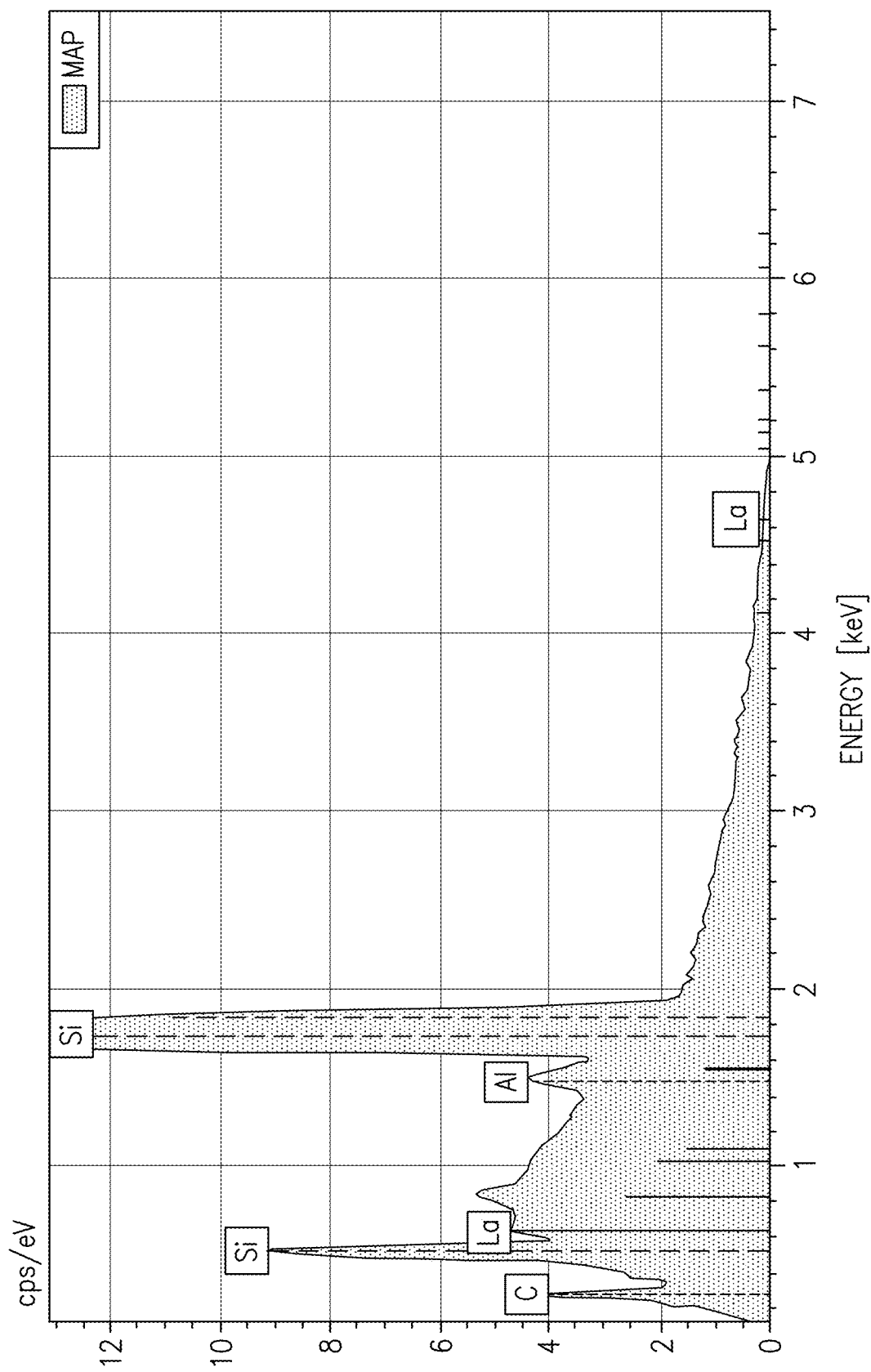
FIG. 8C shows an energy dispersive X-ray spectrum (EDS) taken from one of the locations shown in FIG. 8A where an adhesion strength test has been performed.

FIGS. 8A-8C illustrate experimental evaluation of the adhesion strength of the encapsulation layers formed according to embodiments. FIG. 8A illustrate a wafer map showing locations where experimental adhesion strength test of the encapsulation layer has been performed. Encapsulation layers should have high adhesion strength to underlying layers, e.g., the sidewalls of phase change memory cells as described herein. Accordingly, the adhesion strength of a lanthanum oxide layer formed on a Si substrate has been performed using a tape test, in which an adhesive tape is applied to the lanthanum oxide layer and pulled, and visually inspected to determine if the lanthanum oxide has delaminated. Regions at the center, middle, and edge of a wafer as indicated by the substrate map shown on the left side of FIG. 8A were tested for within-wafer uniformity of the adhesion strength. For statistical quantification of adhesion failures, prior to applying a tape, each of the square regions as illustrated in FIG. 8A was scribed using a diamond pencil into a 10×10 matrix including 100 scribed squares, as shown on the right side of FIG. 8A. Afterwards, the tape was affixed on the encapsulation layer in the square regions and removed by pulling vertically away from wafer surface. The adhesive strength was qualitatively evaluated by counting the number of squares out of the 10×10 matrix of 100 scribed squares that lost the deposited encapsulation layer after pulling out the tape.

FIG. 8B illustrates a scanning electron micrograph (SEM) of one of the scribed squares within a 10×10 matrix where the adhesion strength test has been performed. The SEM images showed residual adhesive glue from the tape throughout the scribed square, which indicates that the encapsulation layer has not been delaminated. An analysis showed that none of the squares within any of the square regions lost the encapsulation layer, indicating that the adhesion strength of encapsulation layers on Si substrate is excellent.

FIG. 8C illustrates an energy dispersive X-ray spectrum (EDS) taken from one of the square regions where adhesion strength test has been performed. The spectrum was taken from 5 of the 100 scribed squares of the 10×10 matrix as shown in FIG. 8B. The EDS peak analysis showed La and Al peak on the films, which indicate that the encapsulation layer including a $LaO_x$ film and an $AlO_x$ capping layer remains after the adhesion test.

Figure 9A:
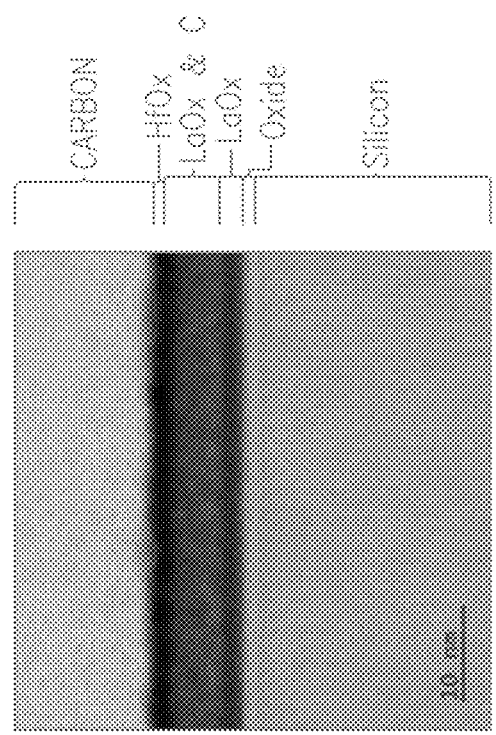
FIG. 9A shows a cross-sectional transmission electron micrograph (XTEM) of an encapsulation layer including a $LaO_x$ layer and a $HfO_x$ layer, according to embodiments.
Figure 9B:
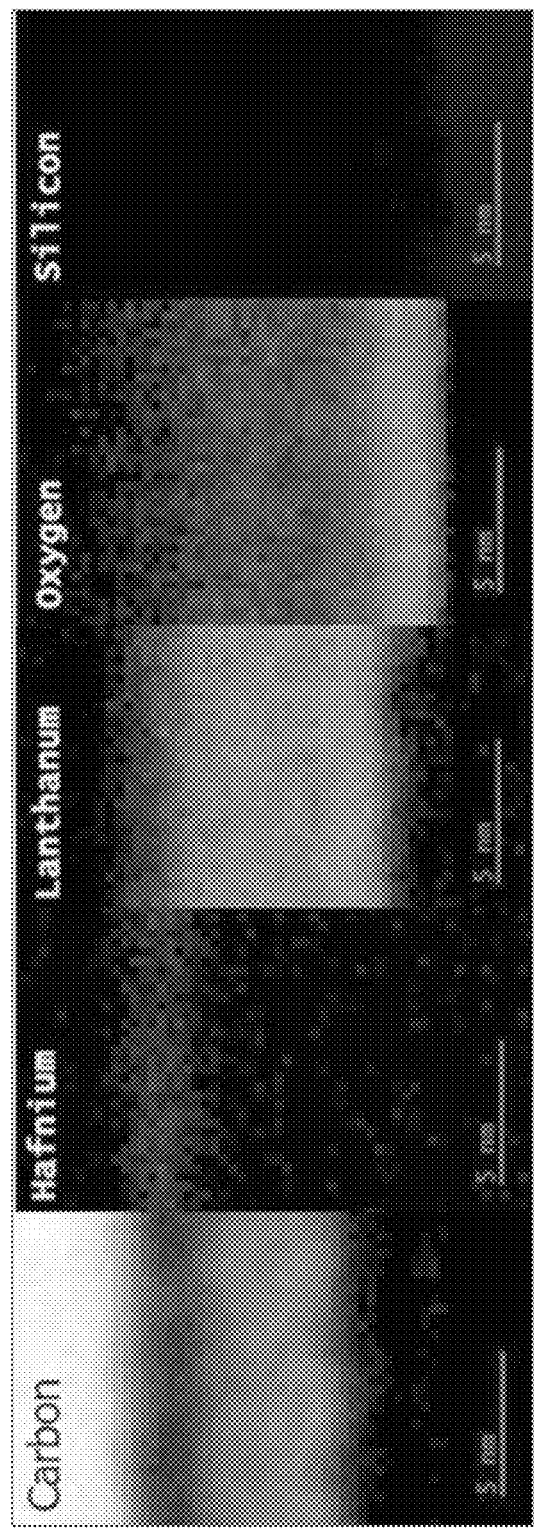
FIG. 9B shows elemental maps obtained from an electron energy loss spectrum (EELS), taken from the cross-sectional region shown in FIG. 9A, according to embodiments.
Figure 9C:
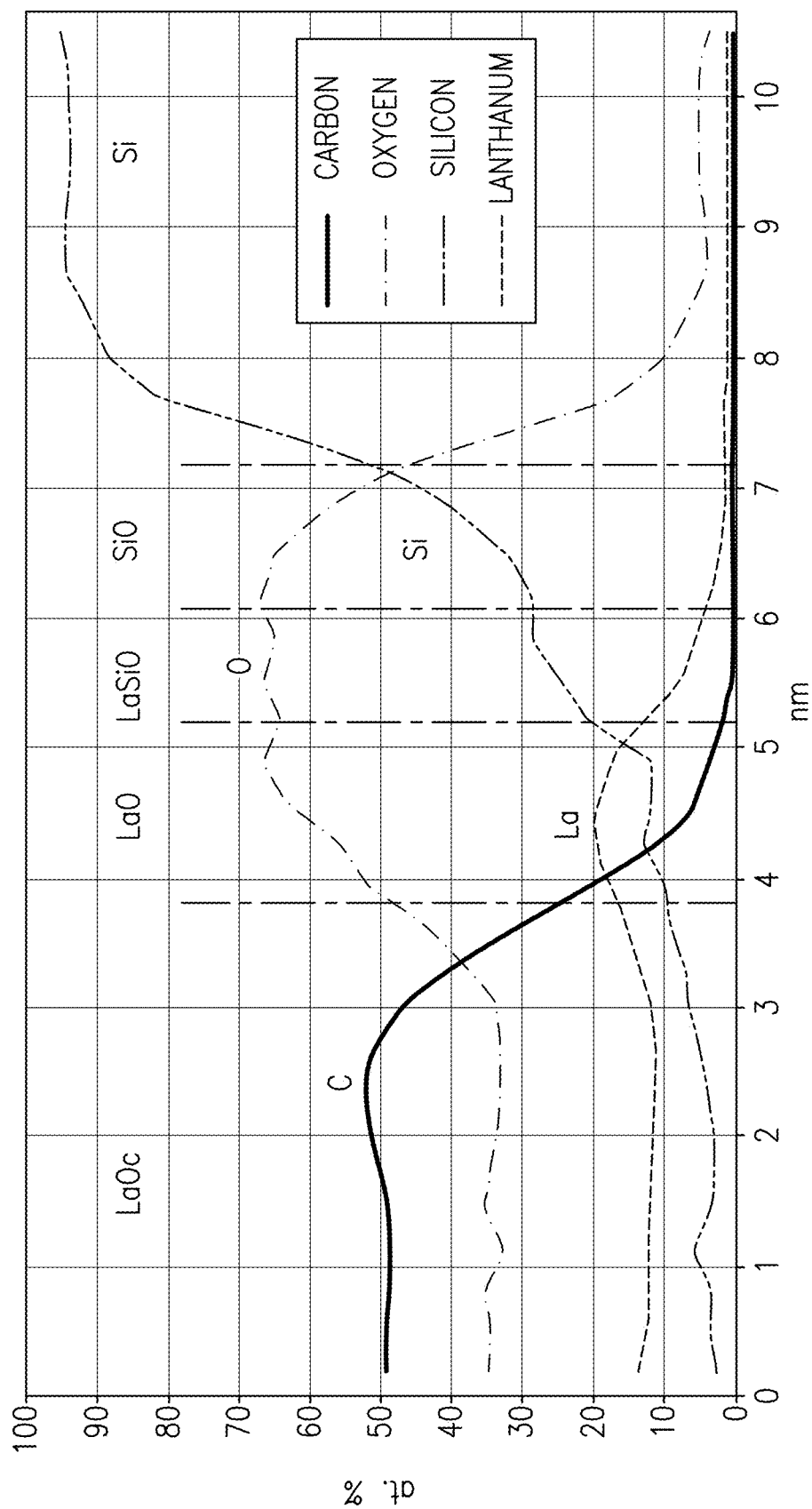
FIG. 9C shows a depth profile of the composition of the encapsulation layer shown in FIG. 9A.

FIG. 9A shows a cross-sectional transmission electron micrograph (XTEM) of an encapsulation layer including a $LaO_x$ layer and a $HfO_x$ layer according to embodiments formed on a Si substrate. FIG. 9B shows elemental maps obtained from an electron energy loss spectrum (EELS) taken from the XTEM shown in FIG. 9A, according to embodiments. FIG. 9C shows a depth profile of the composition of the encapsulation layer imaged in FIG. 9A. The results shown the presence of an interface oxide layer between the lanthanum oxide layer and the Si substrate, which is indicative of the strong affinity between La atoms and oxygen atoms. In addition, the results show that La and Hf did not diffuse to other layers and that the $LaO_x$ and $HfO_x$ layers remained as distinct layers.

Although the present invention has been described herein with reference to the specific embodiments, these embodiments do not serve to limit the invention and are set forth for illustrative purposes. It will be apparent to those skilled in the art that modifications and improvements can be made without departing from the spirit and scope of the invention.

Such simple modifications and improvements of the various embodiments disclosed herein are within the scope of the disclosed technology, and the specific scope of the disclosed technology will be additionally defined by the appended claims.

In the foregoing, it will be appreciated that any feature of any one of the embodiments can be combined or substituted with any other feature of any other one of the embodiments.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while features are presented in a given arrangement, alternative embodiments may perform similar functionalities with different components and/or sensor topologies, and some features may be deleted, moved, added, subdivided, combined, and/or modified. Each of these features may be implemented in a variety of different ways. Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure.

What is claimed is:

1. A method of fabricating a semiconductor device, the method comprising:
   providing a substrate having an exposed surface comprising a chalcogenide material; and
   forming a low-electronegativity (low-χ) metal oxide layer on the chalcogenide material by cyclically exposing the substrate, without aid of plasma, to a low-χ metal precursor and an oxygen precursor comprising $O_2$, wherein the low-χ metal of the low-χ metal precursor has an electronegativity of 1.6 or lower.

2. The method of claim 1, wherein the electronegativity of the low-χ metal is lower than electronegativities of elements of the chalcogenide material.

3. The method of claim 2, wherein the elements of the chalcogenide material comprise one or more of Ge, Sb, Te, Si, Se and As.

4. The method of claim 1, wherein forming the low-χ metal oxide layer comprises cyclically exposing the substrate to the low-χ metal precursor and the oxygen precursor at or below 300° C.

5. The method of claim 4, wherein the low-χ metal is a rare earth metal.

6. The method of claim 5, wherein the rare earth metal is La and the low-χ metal oxide layer comprises a $LaO_x$ layer.

7. The method of claim 6, wherein cyclically exposing comprises exposing the chalcogenide material to a La precursor as the first precursor.

8. The method of claim 7, wherein the La precursor comprises tris(isopropylcyclo pentadienyl)lanthanum.

9. The method of claim 5, wherein providing the substrate comprises providing the chalcogenide material having a surface region comprising oxidized chalcogenide material, and wherein forming the low-χ metal oxide layer comprises chemically reducing the oxidized chalcogenide material with the rare earth metal.

10. The method of claim 5, wherein the low-χ metal oxide layer comprises a substoichiometric rare earth metal oxide.

11. The method of claim 1, further comprising forming a capping metal oxide layer on the low-χ metal oxide layer by cyclically exposing the substrate to a second metal precursor and a second oxygen precursor.

12. The method of claim 11, wherein the capping metal oxide layer comprises $HfO_x$ or $AlO_x$.

13. The method of claim 12, wherein the second oxygen precursor comprises $O_2$ and ozone.

14. The method of claim 1, wherein the substrate comprises an intermediate structure of a cross point array comprising a plurality of memory cells disposed between bitlines and wordlines, the intermediate structure including the chalcogenide material as part of a phase change storage element, and wherein forming the low-χ metal oxide layer comprises forming directly on exposed sidewalls of the phase change storage element.

15. The method of claim 14, wherein forming the low-χ metal oxide layer does not crystallize the phase change storage element.

16. A method of fabricating a semiconductor device, the method comprising:
   providing a substrate having formed thereon a chalcogenide layer;
   patterning the chalcogenide layer to expose sidewalls of the chalcogenide layer; and
   forming a low electronegativity (low-χ) metal oxide layer on the sidewalls of the chalcogenide layer by cyclically exposing the substrate to a low-χ metal precursor and an oxygen precursor at or below 300° C. without aid of plasma, wherein the low-χ metal of the low-χ metal oxide layer has an electronegativity of 1.6 or lower.

17. The method of claim 16, wherein the substrate comprises an intermediate structure of a cross point array comprising a plurality of memory cells disposed between bitlines and wordlines, the intermediate structure including the chalcogenide layer as part of a phase change storage element, and wherein forming the low-χ metal oxide layer comprises forming directly on exposed sidewalls of the phase change storage element.

18. The method of claim 17, wherein the exposed sidewalls of the phase change storage element comprises an oxidized chalcogenide material, and wherein forming the low-χ metal oxide layer comprises chemically reducing the oxidized chalcogenide material with the low-χ metal.

19. The method of claim 17, wherein elements of the chalcogenide layer comprise one or more of Ge, Sb, Te, Si, Se and As.

20. The method of claim 19, wherein the electronegativity of the low-χ metal is lower than electronegativities of the elements of the chalcogenide layer.

21. The method of claim 16, wherein the low-χ metal is a lanthanide element.

22. The method of claim 21, wherein the oxygen precursor comprises $O_2$.

23. The method of claim 16, wherein cyclically exposing comprises exposing the chalcogenide layer to a rare earth metal precursor as the first precursor.

24. The method of claim 23, wherein the rare earth metal precursor comprises a La precursor.

25. The method of claim 16, further comprising forming a capping metal oxide layer on the low-χ metal oxide layer by cyclically exposing the substrate to a second metal precursor and a second oxygen precursor.

26. The method of claim 25, wherein the capping metal oxide layer comprises $HfO_x$ or $AlO_x$.

* * * * *